United States Patent [19]
Takahashi et al.

[11] Patent Number: 5,084,962
[45] Date of Patent: Feb. 4, 1992

[54] APPARATUS FOR AND METHOD OF AUTOMATICALLY MOUNTING ELECTRONIC COMPONENT ON PRINTED CIRCUIT BOARD

[75] Inventors: Kuniaki Takahashi; Koji Kudo; Shinichi Araya; Hitoshi Nakayama, all of Tokyo, Japan

[73] Assignee: TDK Corporation, Tokyo, Japan

[21] Appl. No.: 398,514

[22] Filed: Aug. 24, 1989

[30] Foreign Application Priority Data

| Aug. 24, 1988 | [JP] | Japan | 63-111023[U] |
| Oct. 7, 1988 | [JP] | Japan | 63-131515[U] |
| Oct. 8, 1988 | [JP] | Japan | 63-252926 |
| Oct. 8, 1988 | [JP] | Japan | 63-252927 |
| Oct. 8, 1988 | [JP] | Japan | 63-252928 |
| Oct. 17, 1988 | [JP] | Japan | 63-135132[U] |
| Dec. 9, 1988 | [JP] | Japan | 63-160084[U] |
| Dec. 9, 1988 | [JP] | Japan | 63-160085[U] |
| Jan. 20, 1989 | [JP] | Japan | 64-5309[U] |
| Feb. 3, 1989 | [JP] | Japan | 1-24958 |

[51] Int. Cl.⁵ .................... H05K 3/30; B23P 19/00
[52] U.S. Cl. ........................ 29/833; 29/740; 29/840; 221/289; 269/903
[58] Field of Search ............ 29/827, 840, 740, 741, 29/739; 221/289; 269/903

[56] References Cited

U.S. PATENT DOCUMENTS

| 3,401,832 | 9/1968 | Cremieux | 221/289 X |
| 4,236,306 | 12/1980 | Hug et al. | 29/827 |
| 4,291,867 | 9/1981 | Williams et al. | 269/903 X |
| 4,307,832 | 12/1981 | Taki et al. | 29/740 X |
| 4,329,776 | 5/1982 | Mori et al. | 29/741 |
| 4,381,601 | 5/1983 | Tamai et al. | 29/740 |
| 4,621,419 | 11/1986 | Hino et al. | 29/741 X |
| 4,631,816 | 12/1986 | Fujita et al. | 29/740 |
| 4,675,993 | 6/1987 | Harada | 29/740 |
| 4,740,136 | 4/1988 | Asai et al. | 29/740 X |
| 4,805,110 | 2/1989 | Takahashi et al. | 29/741 X |
| 4,866,837 | 9/1989 | Heissenberger et al. | 29/741 |

FOREIGN PATENT DOCUMENTS 2186218 8/1987 United Kingdom ............... 29/739

Primary Examiner—Carl J. Arbes
Attorney, Agent, or Firm—Helfgott & Karas

[57] ABSTRACT

An automatic electronic component mounting apparatus for automatically mounting electronic components on the printed circuit board includes an electronic component supply mechanism for supplying an electronic component to a predetermined position, at least one mounting head movable in a Y direction, a first controlling mechanism for moving the mounting head in the Y direction, a movable frame movable in an X direction, a second controlling mechanism for moving the movable frame in the X direction and controlling the position of the movable frame in the X direction, a support base supported to the movable frame, and a table carrying a printed circuit board and turnable in a θ direction. The table is rotatably supported on the support base so that when the X directional position of the movable frame is controlled by the second controlling mechanism, the X directional position of the table is also controlled. A third controlling mechanism is provided for controlling a θ directional position of the table. The mounting head holding an electronic component is fed to the predetermined position by the mechanism to mount the electronic component on the printed circuit board.

23 Claims, 19 Drawing Sheets

PRIOR ART
FIG. 1
FIG. 2
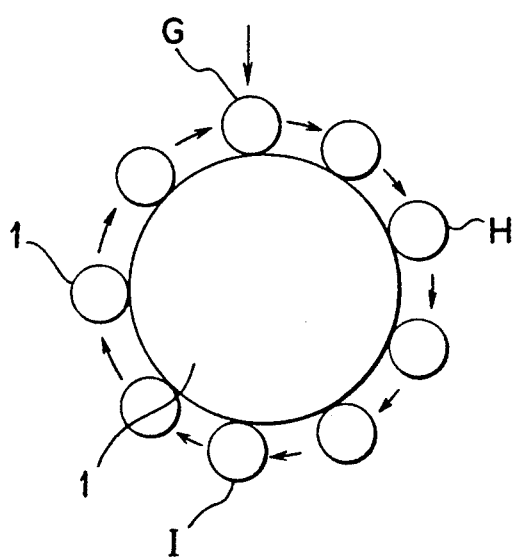
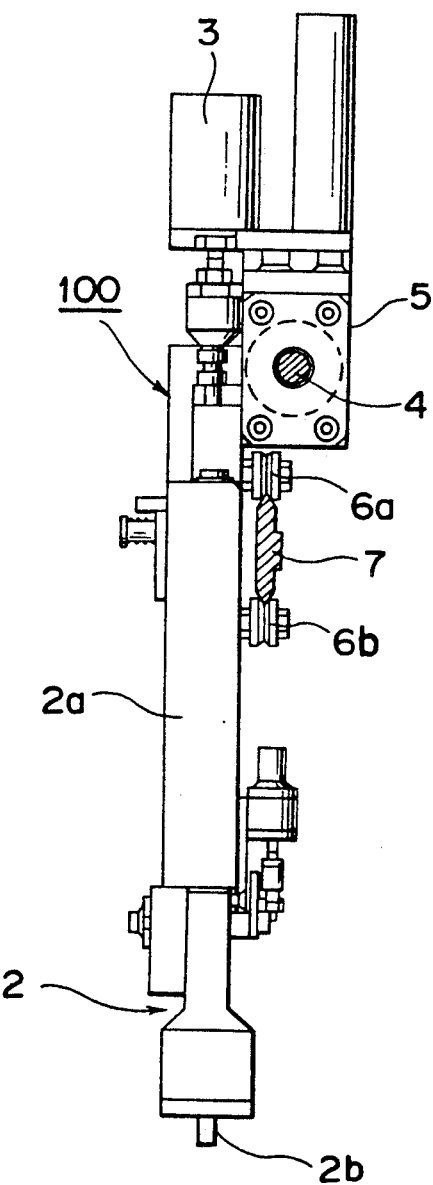

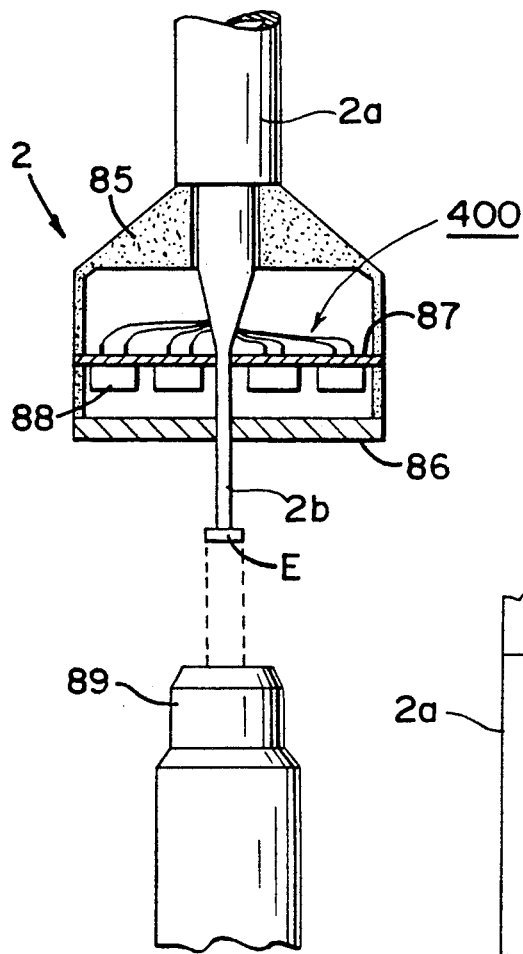
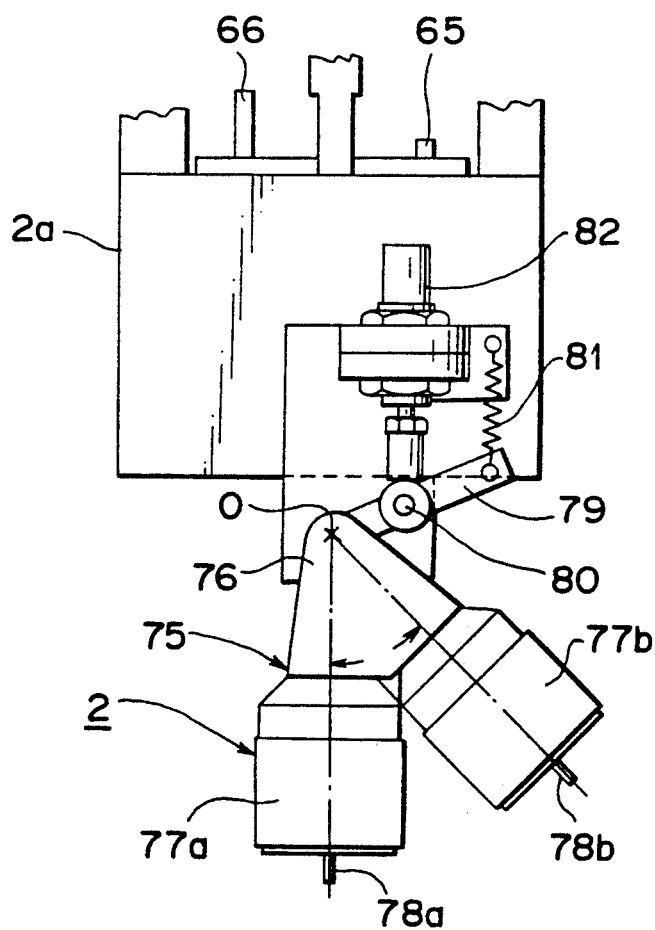

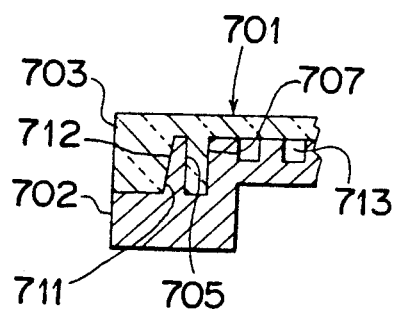
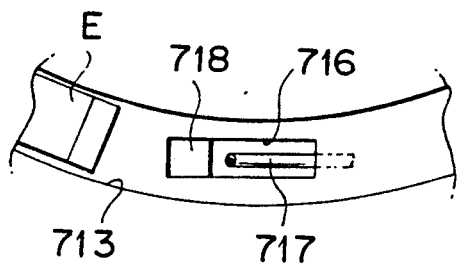
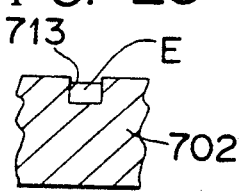
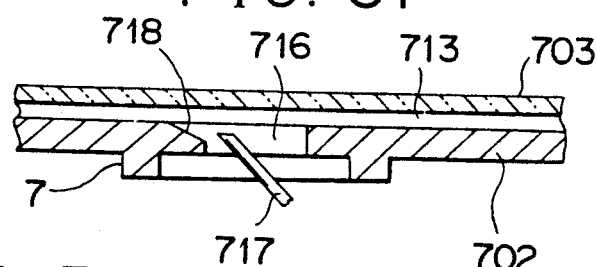
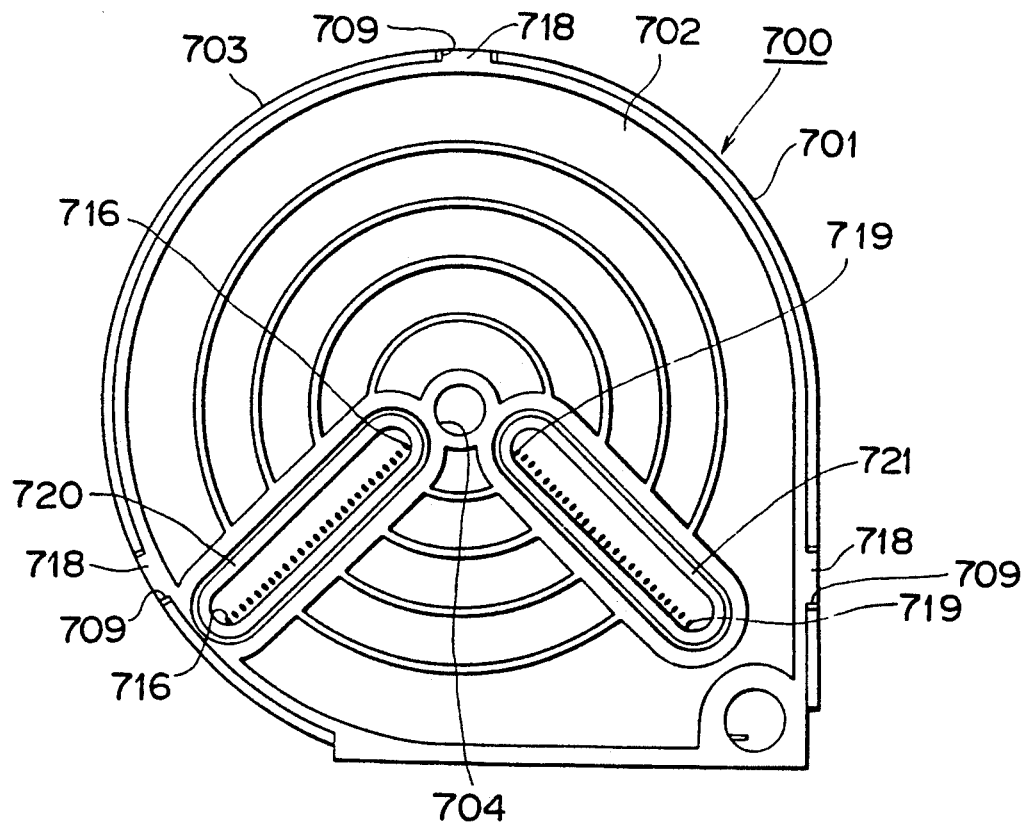

APPARATUS FOR AND METHOD OF AUTOMATICALLY MOUNTING ELECTRONIC COMPONENT ON PRINTED CIRCUIT BOARD

BACKGROUND OF THE INVENTION

1. Field of the Invention

This invention relates to an apparatus and method for automatically mounting chip-type electronic components (hereinafter referred to as "electronic component") on printed circuit boards.

2. Description of the Prior Art

An electronic component mounting apparatus typically includes a supply mechanism for supplying electronic components to a predetermined position; a table for supporting printed circuit boards thereon and adapted to be moved in X and Y directions by means of a drive mechanism; and a mounting head adapted to be moved between the predetermined position and a position above the table and moved vertically with respect to the predetermined position and the printed circuit boards on the table by a drive mechanism, connected to air-absorbing source and for holding via suction the electronic component, supplied by the supply mechanism, one by one at the predetermined position to mount the electronic components on the printed circuit boards supported by the table.

One of the considerations of a useful mounting apparatus is to achieve a precision placement of an electronic component at a predetermined position on a printed circuit board. Unfortunately, in the conventional mounting apparatus, there is a possibility that an electronic component will be placed on a printed circuit board in a wrong posture and/or in a state in which they are positionally deviated from a predetermined position on printed circuit board because the failure in suction of the electronic component in a correct position or posture may occur during the operation of sucking-up the electronic component by means of the mounting head and/or failure in the accurate positioning of the printed circuit board, which is supported on the table, may occur during the movement of the table. Therefore, it is necessary to precisely orient an electronic component before the electronic component is placed on a printed circuit board by means of the mounting head, and control the movement of the table in order to perform the precise positioning of the printed circuit board. For this purpose, some of the conventional mounting apparatuses further include a first camera for picking up a picture of an electronic component held by mounting head, a drive mechanism provided on the mounting head and including a pulse motor and the like and adapted for turning the mounting head, holding an electronic component via suction, in such a direction so as to orient the electronic component; a second camera for picking up a picture of a positioning mark or a fiducial mark, e.g., a through-hole or the like, the positioning mark being previously applied onto a printed circuit board on the X-Y table; and a picture processing unit previously storing therein data on pictures of an electronic component and a positioning mark of a printed circuit board when an electronic component is precisely positioned in a component mounting position of a printed circuit board, the picture processing unit receiving the pictures picked up by the first and second cameras to carry out comparison between the stored picture data and actual pictures obtained by the first and second cameras and send commands to the drive mechanism for turning the mounting head and the drive mechanism for movement of the X-Y table in dependence upon the results of the comparison. According to the commands the mounting head is turned in the $\theta$ direction by its drive mechanism in such a manner that an electronic component held by the mounting head is precisely oriented, and the movement of the X-Y table is controlled by the drive mechanism for the X-Y table in a such manner that a printed circuit board is accurately positioned. However, in the conventional mounting apparatus, the mounting head is provided with the drive mechanism for turning the head in the $\theta$ direction in addition to the drive mechanism for moving the mounting head held an electronic component, supplied to a predetermined position by means of the electronic component supply mechanism, to the position above the X-Y table, so that the mounting head is complex in construction and is rather heavy. Thus, a supporting mechanism for supporting the mounting head becomes large-sized.

Also, in some of the conventional mounting apparatuses, positioning of an electronic component held by the mounting head is performed by inputting into a computor data on coordinates of an electronic component mounting position on a printed circuit board to carry out numeric control. With this method, when a position of a printed circuit board on which a conducting pattern is actually formed is deviated from a position of a conducting preset according to a circuit diagram, an electronic component will be placed on the printed circuit board with electrodes of the electronic component in a position deviated from the conducting pattern on the printed circuit board. Also, when an electronic component treated by the mounting head has leads projecting therefrom and the leads have any defect, e.g., deformation or bending, the mounting head can not precisely locate the electronic component on a printed circuit board.

In the automatic mounting apparatus of this kind, a plurality of mounting heads are required in order to successively mount various kinds of electronic components on a printed circuit board. In order to meet such requirement, some devices of the forgoing type have a plurality of mounting heads adapted to be removably attached to a body for supporting the mounting heads. Tip ends of the mounting heads are different from one another in diameter depending upon dimensions of electronic components which are to be treated by the mounting apparatus. Each time the apparatus treats different electronic components, an operator installs mounting heads, having tip ends of diameters suitable for treating the electronic components, on the body for supporting the mounting heads. However, this requires substantial time, resulting in lower efficiency in mounting of the electronic components on printed circuit boards.

An example of an electronic component mounting system performed by an automatic mounting apparatus having a plurality of mounting heads is found, for example, in Japanese Patent Provisionary Publication No. 167802/1986. As shown in FIG. 1, this automatic mounting apparatus includes a rotating disk 1 adapted to intermittently rotate and a plurality of mounting heads 2 provided with respect to the rotating disk 1. The mounting heads can be arranged along a periphery of the rotating disk 1 at regular intervals and electronic components are adapted to be successively mounted on printed circuit boards by sequential movement of the mounting heads. More particularly, in the conventional mounting system, an electronic component supplied by an electronic component supply mechanism (not shown) is sucked up at a position G by means of one of the mounting heads 2, the electronic component held by the mounting head is then subjected to inspecting (inspecting a posture of the electronic component sucked up by the mounting head, and leads of the electronic component) through an image processing when the mounting head 2 holding the electronic component reaches a position H upon the intermittent rotation of the rotating disk 1, and the mounting head 2 is actuated to place the electronic component in a predetermined mounting position of a printed circuit board (not shown) when the mounting head reaches a position I upon further intermittent rotation of the rotating disk 1. However, in the conventional mounting system shown in FIG. 1, even though the mounting apparatus has a plurality of the mounting heads as described above, the movement of each of the mounting heads is limited to sequential movement, so that the conventional mounting system is undesirable from the point of view of improvement in the efficiency of the mounting operation.

SUMMARY OF THE INVENTION

The present invention has been made avoid the foregoing disadvantages of the prior art.

Accordingly, it is an object of the present invention to provide an apparatus and method for mounting electronic components on printed circuit boards which is capable of precisely mounting an electronic component in a predetermined position of a printed circuit board.

It is another object of the present invention to provide such an apparatus and method for mounting electronic components on printed circuit boards, which is capable of efficiently carrying out the mounting operation.

It is still another object of the present invention to provide such an apparatus having a mounting head which is lightweight and simple in construction.

BRIEF DESCRIPTION OF THE DRAWINGS

These and other objects and many advantages of the present invention will be readily appreciated as the same becomes better understood by reference to the following detailed description when considered in connection with the accompanying drawings, in which like reference numerals designate like or corresponding parts throughout; wherein FIG. 1 is a schematic view of a mounting apparatus for performing a conventional method of mounting electronic component on a printed circuit board;

FIG. 2 is a schematic side view showing an electronic component mounting head incorporated in an electronic component mounting apparatus according to this invention;

FIG. 10 is a partial, front view of the mounting head of FIG. 9, on enlarged scale;

FIG. 11 is a sectional view of another modification of the mounting head;

FIG. 28 is a fragmentary sectional view of a cover plate portion and a base portion;

FIG. 29 is a fragmentary sectional view of the base portion;

FIG. 30 is a fragmentary front view of the base portion;

FIG. 31 is a fragmentary sectional view of the elongate through-hole;

FIG. 32 is a rear elevation of the cover plate;

DETAILED DESCRIPTION OF THE PREFERRED EMBODIMENTS

Figure 3:
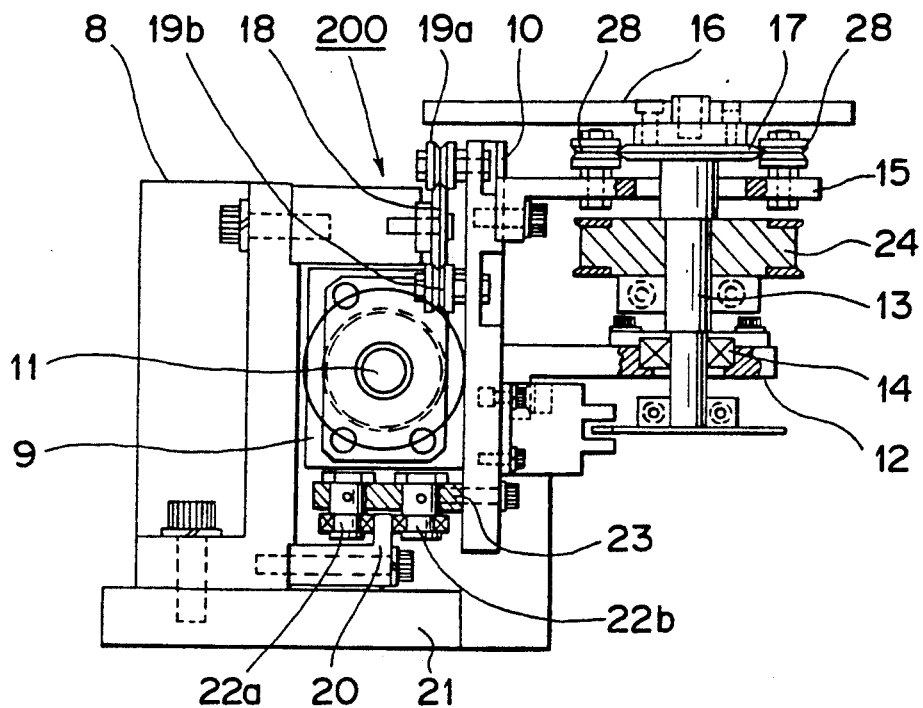
FIG. 3 is a partially sectional side view of one embodiment of a printed circuit board supporting mechanism incorporated in the mounting apparatus according to the present invention.

An automatic electronic component mounting apparatus according to the present invention will be described hereinafter with reference to the accompanying drawings.

The automatic electronic component mounting apparatus according to the present invention generally includes a supply mechanism for supplying electronic components to a predetermined position (hereinafter referred to as "an electronic component supply position"), a supporting mechanism for supporting a printed circuit board, and at least one mounting mechanism for holding an electronic component, supplied by means of the supply mechanism, to mount it on the printed circuit board supported by the supporting mechanism.

The electronic component supply mechanism includes a bulk feeder, and a pallet feeder, a magazine feeder, a tape feeder or the like.

Referring now to FIG. 2, there is shown an electronic component mounting mechanism of the automatic mounting apparatus. The mounting mechanism 100 includes a mounting head 2 supported by a body 2a and having a suction nozzle 2b connected to an air-absorbing source for sucking up an electronic component supplied to the electronic component supply position by the electronic component supply mechanism. The mounting head 2 is connected through the body 2a to drive means 3, e.g., a drive cylinder and adapted to be moved vertically by the first drive means 3 with respect to the electronic component supply position and an electronic component mounting position on a printed circuit board on which an electronic component, held by the suction nozzle 2b, is to be mounted. Further, the mounting head 2, after the suction nozzle 2b sucks up an electronic component at the electronic component supply position, is adapted to be moved to a position above the electronic component mounting position by a driving mechanism. In the illustrated embodiment, the mounting head is adapted to be moved forward and backward in a Y direction (corresponding to a direction perpendicular to the plane of FIG. 2) with respect to the position above the electronic component mounting position by the driving mechanism. The driving mechanism for the Y directional movement of the mounting head 2 may include a drive cylinder and a threaded shaft, ball screws or the like for supporting the body 2a of the mounting head 2 therethrough. In the illustrated embodiment, the driving mechanism includes an elongate threaded shaft 4 rotatably threaded through a flange portion 5, which is formed integrally with the body 2a, to extend in the Y direction, upper and lower guide rollers 6a, 6b supported through axes to the body 2a and separated vertically from each other, and a guide rail supported between the guide rollers 6a, 6b so as to be interposed between the guide rollers 6a, 6b. The threaded shaft 4 is connected to a first DC servomotor (not shown). When the threaded shaft 4 is rotated by the first DC servomotor according to a predetermined program, the flange portion 5 is moved in the Y direction on the threaded shaft 4 relative to the rotation of the threaded shaft 4, whereby the mounting head 2 is likewise moved in the Y direction.

The automatic mounting apparatus according to the present invention further includes first optical detection means (not shown), e.g., a camera for detecting an electronic component held on the suction nozzle 2b of the mounting head 2, second optical detection means (not shown), e.g., a camera for detecting a positioning mark of a printed circuit board supported by the printed circuit board supporting mechanism, the positioning mark being previously formed on the printed circuit board, and a picture processing unit (not shown). The picture processing unit previously stores data on pictures of an electronic component and a positioning mark of a printed circuit board in a such state that an electronic component is precisely located in an electronic component mounting position of a printed circuit board and is electrically connected to a control section. The control section is electrically connected to an electronic component mounting mechanism 100 and a printed circuit board supporting mechanism. The first and second optical detection means are electrically connected to the picture processing unit and adapted to pick up a picture of an electronic component held on the suction nozzle 2b of the mounting head 2 and a picture of a positioning mark of a printed circuit board on which the electronic component is to be mounted, respectively, to send the pictures to the picture processing unit. As will be described in greater detail hereinafter, the Y directional movement of the mounting head 2 holding an electronic component through its suction head 2b is adapted to be regulated by controlling the revolution of the first DC servomotor, to which the threaded shaft 4 is connected, by means of the control section depending upon data obtained by processing a picture of a positioning mark of a printed circuit board which is picked up by the second optical detection means and sent to the picture processing unit.

Figure 4:
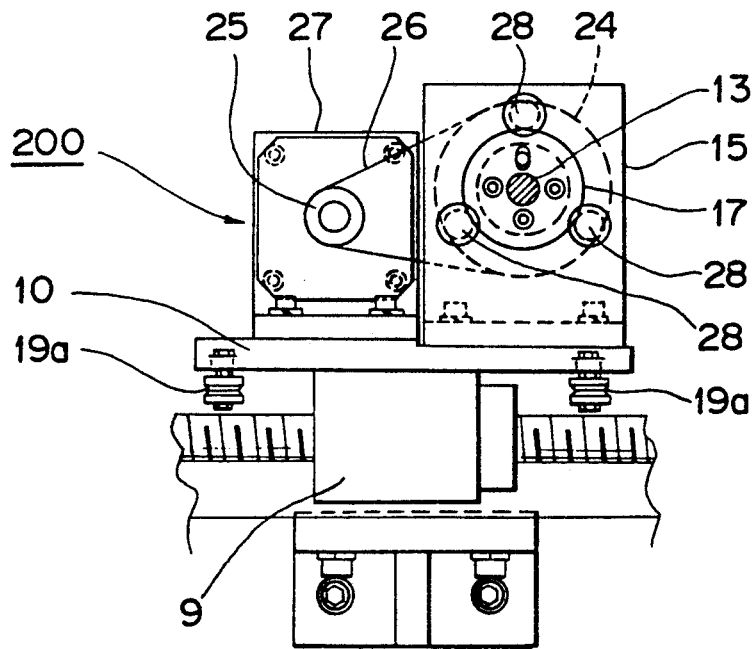
FIG. 4 is a plan view of a printed circuit board supporting mechanism, wherein a table is removed from a rotating shaft for clarity of illustration.

Referring to FIGS. 3 and 4, there is shown the printed circuit board supporting mechanism briefly described above. The supporting mechanism 200 generally includes a body frame 8 of a substantially C-shape in vertical section, a movable frame 9 located in an opening of the C-shaped body frame 8 and having a side plate 10 formed integrally therewith, an elongate threaded shaft 11 rotatably threaded through the movable frame 9 to extend in an X direction perpendicular to the moving direction of the mounting head 2, i.e., the Y direction and for supporting the movable frame 9, a supporting base 12 projecting laterally from a middle portion of the side plate 10 of the movable frame 9, a rotating shaft 13 rotatably supported through a bearing 14 to the supporting base 12 and extending upwardly from the supporting base 12 to penetrate a horizontal plate 15 projecting laterally from an upper portion of the side plate 10 in parallel with the supporting base 12, and a table 16 supported through a substantially disk-like guide 17 on an upper end of the rotating shaft 13 and for supporting a printed circuit board thereon.

The C-shaped body frame 8 has a first guide rail 18 mounted on a side of its upper laterally projecting portion so as to extend in the same direction that of the threaded shaft 11. Also, the side plate 10 of the movable frame 9 has a plurality of upper guide rollers 19a and a plurality of lower guide rollers 19b which are supported through axes to a side of an upper portion of the side plate 10, between which upper and lower guide rollers 19a, 19b the first guide rail 18 is interposed. The threaded shaft 11 is connected to a second DC servomotor. When the threaded shaft 11 is rotated by actuation of the non-shown drive means of the printed circuit board supporting mechanism 200, the movable frame 9 is moved in the X direction along the threaded shaft 11 relative to the rotation of the threaded shaft 11 while being guided by the body frame 8, whereby the table 16 is likewise moved in the X direction perpendicular to the Y direction. As will be described in greater detail hereinafter, the X directional movement of the movable frame 9 is regulated by controlling the revolution of the second DC servomotor, to which the threaded shaft 11 is connected, by means of the control section depending upon the data which are obtained by processing a picture of a positioning mark of a printed circuit board which is picked up by the second optical detection means and sent to the picture processing unit. During the X directional movement of the movable frame 8 relative to the rotation of the threaded shaft 11, the movable frame 9 might jolt from side to side. Accordingly, it is necessary to prevent such jolting of the movable frame 9. For this purpose, a second guide rail 20 is mounted on a base portion 21 of the body frame 8. The second guide rail 20 is interposed between slide shoes 22a, 22b provided on a horizontal plate 23 which is projected laterally from a side of a lower portion of the side plate 10, whereby the movable frame 9 can stably move in the X direction relative to the rotation of threaded shaft 11 without jolting from side to side.

The rotating shaft 13 carrying table 16 has a timing pulley 24 mounted on its axis and coupled to a small-sized driving pulley 25 through an endless belt 26 as shown in FIG. 4. The driving pulley 25 is connected to a third DC servomotor 27, which third DC servomotor 27 is supported by the side plate 10. Thus, power transmitted to the driving pulley 25 from the third DC servomotor 27 is transmitted through the endless belt 26 to the timing pulley 24 to cause the timing pulley 24 to be rotated, resulting in the rotation of shaft 13. Simultaneously with the rotation of the rotating shaft 13, the table 16 is turned (the turning direction of table 16 is hereinafter referred to as a $\theta$ direction). When an actual picture of an electronic component held by the suction nozzle 2b of the mounting head 2 is picked up by the first optical detection means to be sent to the picture processing unit as described above, the picture processing unit carries out comparison between the stored picture data on an electronic component, which data are previously stored in the picture processing unit, and the actual picture of the electronic component held by the suction nozzle 2b of the mounting head 2. In the case where it is detected through the comparing operation that there is an angular deviation between the stored component picture data and the actual picture of the electronic component held by the suction nozzle 2b, a value of the angular deviation between the stored picture data and the actual picture is calculated by the picture processing unit. Then, the control section controls the revolution of the third DC servomotor 27 of the printed circuit board supporting mechanism 200 in such manner that the table 16 is turned in the $\theta$ direction through the rotating shaft 13 by an angle corresponding to the calculated angular deviation value. As a result, a printed circuit board on the table 16 is simultaneously turned by the same angle so that an electronic component mounting position of the printed circuit board may be allowed to be angularly aligned in the $\theta$ direction with the electronic component held on the suction nozzle 2b of the mounting head 2. In order to facilitate stable turning of the table 16, a plurality of guide rollers 28 are rotatably supported to vertical axes which are secured to the horizontal plate 15 in a manner to surround the disk-like guide 17, so that the guide rollers 28 are engaged with the disk-like guide 17. Thus, when the rotating shaft 13 is rotated, the table 16 will stably turned.

In the automatic electronic component mounting apparatus of the present invention constructed as described above, an electronic component supplied to the electronic component supply position by means of the electronic component supply mechanism is sucked by means of the suction nozzle 2b of the mounting head 2. After the suction nozzle 2b has sucked the electronic component at the electronic component supply position, the mounting head 2 is moved upwardly by the drive means 3. Then, a picture of the electronic component held on the suction nozzle 2b of the mounting head 2 is picked up by the first optical detection means to be sent to the picture processing unit as described above. The picture processing unit carries out comparison between the stored picture data on an electronic component and the actual picture of the component obtained by the first optical detection means. Also, a picture of a positioning mark of a printed circuit board on which the electronic component is to be mounted is picked up by the second optical detection means to be sent to the picture processing unit. The picture processing unit carries out comparison between the stored picture data on a positioning mark, which data are previously stored in the picture processing unit, and the actual picture of the positioning mark of the printed circuit board which is sent to the picture processing unit from the second optical detection means. As a result, when it is judged that there is no angular deviation between the stored picture data on an electronic component and the actual component picture and there is no positional deviation between the stored picture data on a positioning mark and the actual picture of the positioning mark, the mounting head 2 is moved along the threaded shaft 4 toward a position above the electronic component mounting position of the printed circuit board by the first DC servomotor to which the threaded shaft 4 is connected, according to a predetermined program. When the mounting head 2 reaches the position above the electronic component mounting position, the mounting head 2 is lowered due to the actuation of the drive means 3, resulting in the electronic component being precisely located in the electronic component mounting position of the printed circuit board.

If it is detected through the comparing operation between the stored component picture data and the actual picture of the electronic component that there is an angular deviation between the stored component picture data and the actual picture of the component, a value of the angular deviation is calculated by the picture processing unit. Then, the control section controls the revolution of the third DC servomotor 27 of the printed circuit board supporting mechanism 200 in such a manner that the table 16 is turned through the rotating shaft 13 by an angle corresponding to the calculated angular deviation value, whereby a printed circuit board, on which the electronic component is to be mounted, on the table 16 is turned in the $\theta$ direction by the same angle. Thus, the angular deviation of the electronic component, held on the suction nozzle 2b, with respect to an electronic component mounting position of the printed circuit board, on which the electronic component is to be mounted, is corrected. Also, when it is detected through the comparing operation between the stored data on a positioning mark and the actual picture of the positioning mark of the printed circuit board which is sent to the picture processing unit from the second optical detection means that there is a positional deviation in the Y direction between the stored picture data on a positioning mark and the actual picture of the positioning mark of the printed circuit board, a value of the positional deviation is calculated by the picture processing unit. Then, the control section controls the revolution of the first DC servomotor to which the threaded shaft 4 of the mounting mechanism 100 is connected, to cause the threaded shaft 4 to be rotated depending upon the calculated value of the positional deviation, whereby the mounting head 2 is moved to a position above the component mounting position and is positionally aligned with the electronic component mounting position in the Y direction. Thus, the electronic component held by the suction nozzle 2b of the mounting head 2 is positionally aligned in the Y direction with the electronic component mounting position of the printed circuit board on which the electronic component is to be mounted. Further, when it is detected through the comparing operation between the stored picture data on a positioning mark and the actual picture of the positioning mark picked up by the second optical detection means that there is a positional deviation in the X direction between the stored picture data and the actual picture of the positioning mark, a value of the positional deviation is calculated by the picture processing unit. Then, the control section controls the revolution of the second DC servomotor, to which the threaded shaft 11 of the printed circuit board supporting mechanism 200 is connected, to cause the threaded shaft 11 to be rotated depending upon the calculated value of the positional deviation, whereby the table 16 is moved in the X direction in a manner such that the electronic component mounting position of the printed circuit board on the table 16 is allowed to be positionally aligned in the X direction with the electronic component held on the suction nozzle 2b. After the electronic component held on the suction nozzle 2b is positionally aligned in the X, Y and θ directions with the electronic component mounting position of the printed circuit board, the mounting head 2 is moved downwardly with respect to the electronic component mounting position of the printed circuit board by the drive means 3, whereby the electronic component is precisely placed over the electronic component mounting position of the printed circuit board.

As described above, in the automatic electronic component mounting apparatus according to the present invention, angular and positional alignment of an electronic component with an electronic component mounting position of a printed circuit board can be precisely and efficiently performed. In addition, since the electronic component mounting mechanism has only the driving mechanism for moving the mounting head in the Y direction except the drive means for moving the mounting head vertically, the mounting head is lightweight and simple in construction.

As briefly described above, the suction nozzle 2b of the mounting head 2 is connected to the air-absorbing source. In order to facilitate releasing of vacuum within the suction nozzle 2b when the suction nozzle 2b with an electronic component thereon places the electronic component in the electronic component mounting position of a printed circuit board, the automatic electronic component mounting apparatus according to the present invention may include switching means for operatively connecting the suction nozzle 2b to an air-absorbing source, when the suction nozzle 2b is to hold an electronic component at the electronic component supply position, to apply negative pressure to the suction nozzle 2b, and operatively connecting the suction nozzle 2b to an air supply source, when the suction nozzle 2b is to place the electronic component on a printed circuit board, to apply positive pressure to the suction nozzle 2b.

Figure 5:
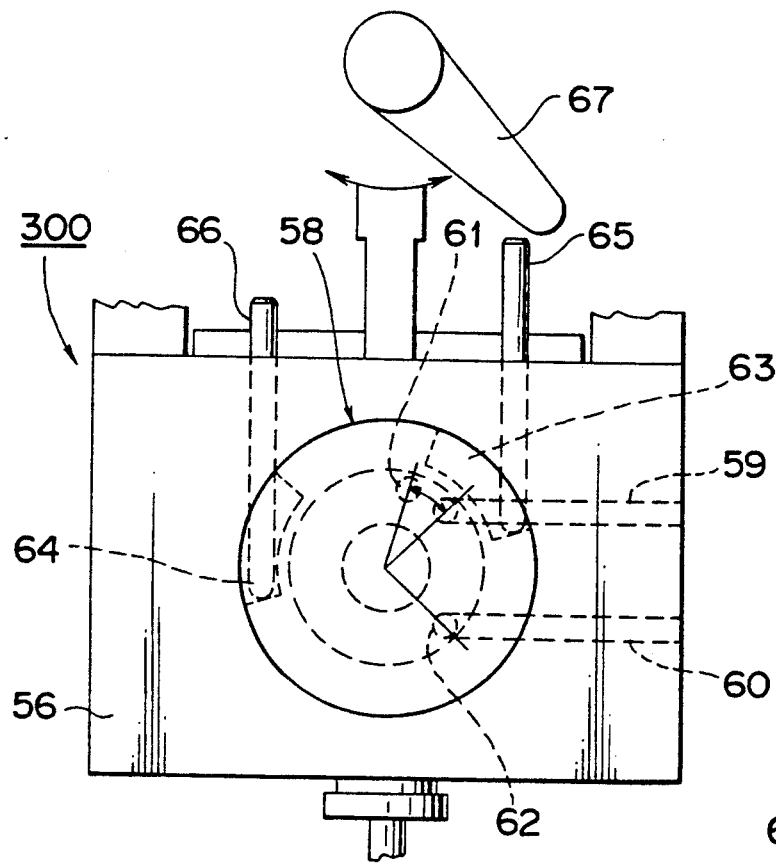
FIG. 5 is a front view of a switching device which may be incorporated into the mounting head.
Figure 6:
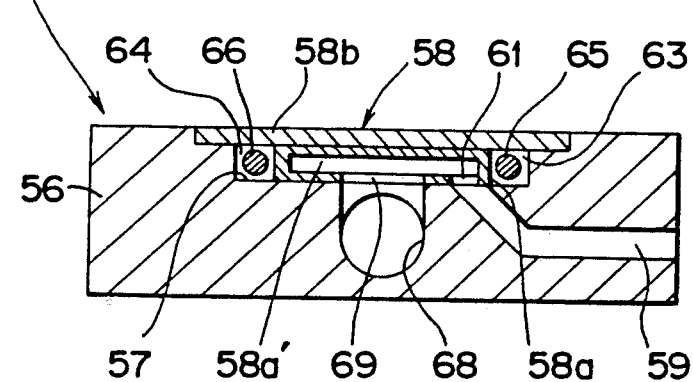
FIG. 6 is a sectional view of the switching device of FIG. 5.

Referring now to FIGS. 5 and 6, there is shown a switching mechanism 300. The switching mechanism 300 includes a relatively heavy, sectioned plate-like body 56 which is formed with a recess 57 including a large circular portion and a small circular portion. Rotatably received in the recess 57 of the body 56 is a valve member 58 including a small circular hollow base portion 58a and a large circular plate portion 58b integrally formed on the hollow base portion 58a. As will be described in greater detail hereinafter, the valve member 58 is adapted to be rotated in clockwise and counterclockwise directions by predetermined angles. The body 56 has first and second passageways 59, 60 formed therein, which passageways 59, 60 extend from one side of the body 56 toward the recess 57 of the body 56 at a predetermined space therebetween to reach a bottom surface of the recess 57, thereby communicating with the recess 57. The first passageway 59 is connected at its outer end to an air supply source (not shown), whereas the second passageway 60 is connected at its outer end to a vacuum source (not shown). Also, the valve member 58 has first and second through-holes 61, 62 formed at a bottom portion of its hollow base portion 58a, which through-holes 61, 62 are positioned at an angle, more than the predetermined space between the first and second passageways 59, 60, around the circular base portion 58a from each other. When the valve member 58 is rotated in the clockwise direction by the predetermined angle, the first through-hole 61 is positionally aligned with an inner end of the first passageway 59 of the body 56, whereas the second through-hole 62 is positionally deviated from an inner end of the second passageway 60. On the contrary, when the valve member 58 is rotated in the counterclockwise direction by the predetermined angle, the first through-hole 61 is positionally deviated from the inner end of the first passageway 59 of the body 56, whereas the second through-hole 62 is positionally aligned with the inner end of the second passageway 60 of the body 56. Incidentally, in a state shown in FIG. 5, the second through-hole 62 is positionally aligned with the inner end of the second passageway 60, whereby the suction nozzle of the mounting head is operatively connected to the non-shown vacuum source as described in greater detail hereinafter. Also, in a state shown in FIG. 6, the first through-hole 61 is positionally aligned with the inner end of the first passageway 59, whereby the suction nozzle of the mounting head is operatively connected to the non-shown air supply source. Also, the valve member 58 has two spaced cutouts 63, 64 formed at predetermined portions of a periphery of its circular base portion 58a. In FIGS. 5 and 6, reference numerals 65, 66 designate a first switching pin and a second switching pin, respectively. The first switching pin 65 is inserted in a first vertical bore, which is formed in the body 56 in a manner to extend vertically to communicate with the recess 57, to be engaged at its lower end with the cutout portion 63 of the valve member 58. Likewise, the second switching pin 66 is inserted in a second bore, which is formed in the body 56 in a manner to extend vertically to communicate with the recess 57, to be engaged at its lower end with the cutout portion 64 of the valve member 58. An upper end portion of each of the switching pins 65, 66 projects upwardly from the body 56. Located above the switching pins 65, 66 with being spaced uniformly from the switching pins is a swinging plate or cam plate 67. The swinging plate 67 is adapted to be swung in the clockwise and counterclockwise directions by predetermined angles by drive means (not shown), e.g., a reversible motor. In a state shown in FIG. 5, when the swinging plate 67 is swung in the clockwise direction by the drive means and a lower end of the swinging plate 67 reaches a position left and above the second switching pin 66, the clockwise swinging of the swinging plate 67 is adapted to be completed. During such clockwise swinging of the swinging plate 67, the swinging plate 67 is abutted at its lower end portion against the first switching pin 65 to depress the first switching pin 65, thereby causing the valve member 58 to be rotated in the clockwise direction by the predetermined angle. Simultaneously with such rotation of the valve member 58, the second switching pin 66 is moved upwardly. Also, in a state of the lower end portion when the swinging plate 67 is at the position left and above the second switching pin 66 as the swinging plate 67 is swung in the counterclockwise direction by the drive means and comes to the state shown in FIG. 5, the counterclockwise swinging of the swinging plate 67 is completed. During such counterclockwise swinging of the swinging plate 67, the swinging plate 67 is abutted at its lower end portion against the second switching pin 66 to depress the second switching pin 66, thereby causing the valve member 58 to be rotated in the counterclockwise direction by the predetermined angle. Simultaneously with such rotation of the valve member 58, the first switching pin 65 is moved upwardly.

Figure 7:
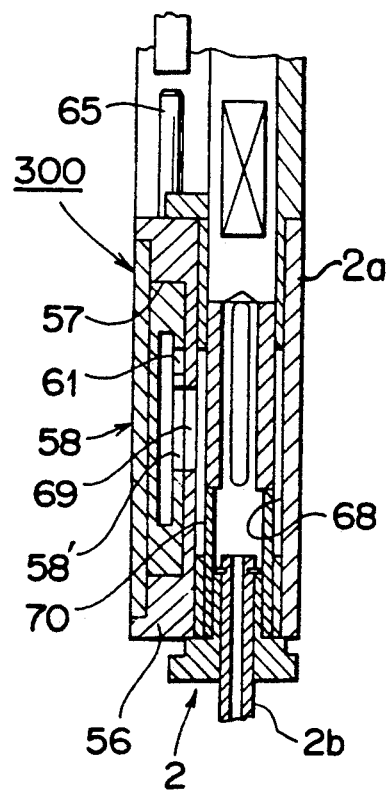
FIG. 7 is a sectional view of the mounting head having the switching device incorporated therein.
Figure 8:
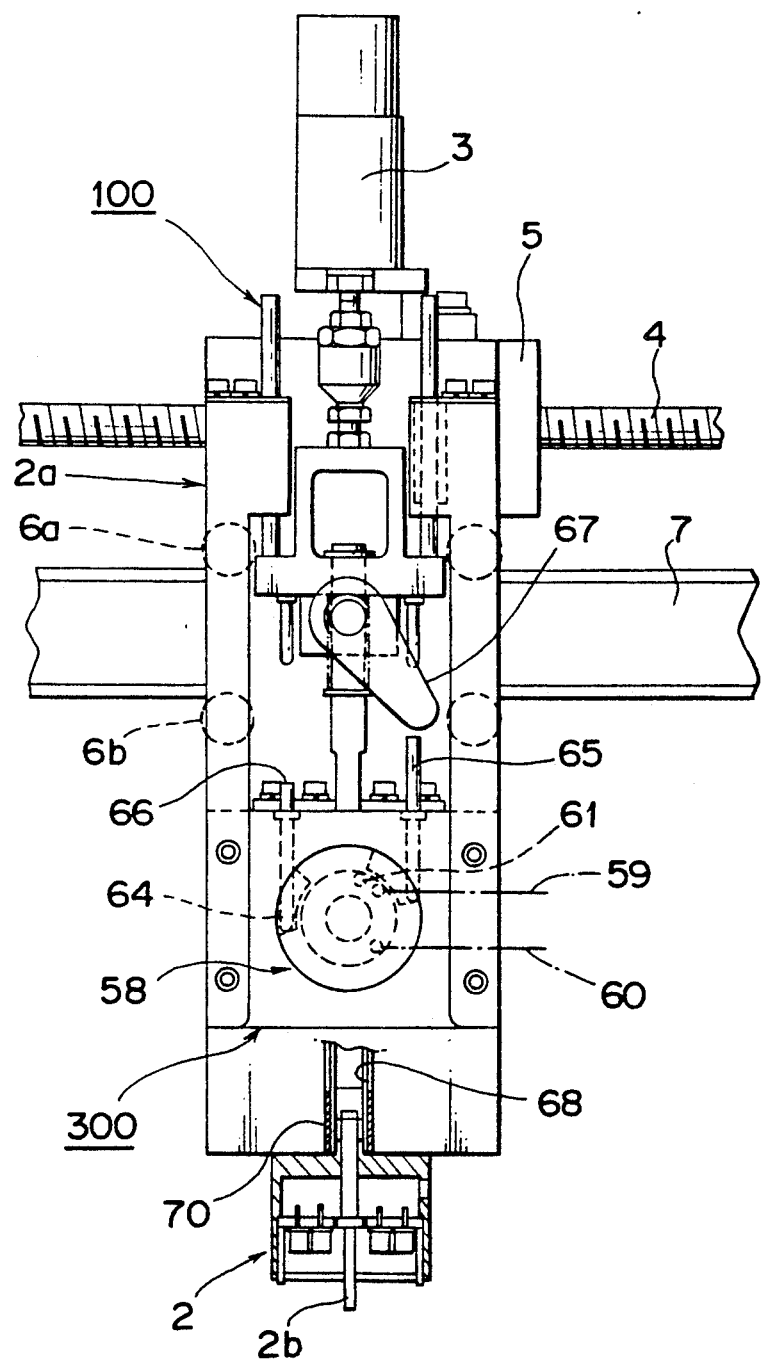
FIG. 8 is a front view of the mounting head of FIG. 7.

The switching mechanism 300 constructed as described above is adapted to be incorporated in the mounting head body 2a as shown in FIGS. 7 and 8. In FIGS. 7 and 8, parts which are identical to those shown in FIG. 2 are identified by the same designators and the description of them will not be repeated. The body 56 of the switching mechanism 300 has a cylinder portion 68 which communicates through a central opening 69, formed at the bottom of the hollow base portion 58a of the valve member 58, with the interior 58a' of the hollow base portion 58a. Fitted into the cylinder portion 68 as shown in FIG. 7 is a sleeve pipe 70 having an opening (not shown), at a lower end portion of which sleeve pipe 70 the mounting head 2 is formed such that the nozzle 2b is connected to the sleeve pipe. The swinging plate 67 is rotatably supported on a predetermined portion of the mounting head body 2a and may be adapted to be swung by the drive means synchronously with the actuation of the drive means 3 for causing the mounting head 2 to be moved vertically. As briefly described above, when the first through-hole 61 of the valve member 58 is positionally aligned with the first passageway 59 of the body 56 with the clockwise rotation of the valve member 58, the suction nozzle 2b of the mounting head 2 is operatively connected to the non-shown air supply source. In this condition, when the air supply source is operated, air is supplied from the air supply source to the suction nozzle 2b. More particularly, air supplied by the air supply source flows through the first passageway 59 of the body 56 and the through-hole 61 of the valve member 58, which are operatively connected to each other, into the interior 58a' of the hollow base portion 58a of the valve member 58 and then passes through the central opening 69 of the valve member 58, the cylinder portion 68 and the sleeve pipe 70 to flow into the suction nozzle 2b. Also, in the case where the second through-hole 62 of the valve member 58 is operatively connected to the second passageway 60 of the body 56 with the counterclockwise rotation of the valve member 58, the suction nozzle 2b of the mounting head 2 is operatively connected to the non-shown vacuum source. In this condition, when the vacuum source is operated, the suction nozzle is evacuated.

In the mounting mechanism 100 having the switching mechanism 300 constructed as described above, when the suction nozzle 2b of the mounting head 2 is to hold an electronic component supplied by the electronic component supply mechanism, the drive means 3 is actuated to cause the mounting head 2 to be moved downwardly with respect to an electronic component, which is supplied to the electronic component supply position by the electronic component supply mechanism, resulting in the suction nozzle 2b in coming into contact with the electronic component. At this time, the swinging plate 67 is in a state reverse to the state shown in FIG. 5, or the lower end of the swinging plate 67 is at the position left and above the second switching pin 66. In this condition, the swinging plate 67 is swung in the counterclockwise direction by the drive means to come to the condition shown in FIG. 5, during which the swinging plate 67 is abutted at its lower end portion against the second switching pin 66 to depress the second switching pin 66. Simultaneously with this, the valve member 58 is rotated in the counterclockwise direction by the predetermined angle, resulting in the second through-hole 62 of the valve member 58 being positionally aligned with the second passageway 60 of the body 56. Thus, the suction nozzle 2b of the mounting head 2 is operatively connected to the vacuum source as described above. Then, the vacuum source is operated to produce vacuum, resulting in the suction nozzle 2b sucking the electronic component. After the suction nozzle 2b has sucked the electronic component, the mounting head 2 is moved upwardly by the drive means 3. Then, the flange portion 5 is moved in the Y direction on the threaded shaft 4 as described above, whereby the mounting head 2 is moved in the same direction while being stably guided along the guide rail 7 through the guide rollers 6a, 6b. When the mounting head reaches a position above the electronic component mounting position of a printed circuit board, the mounting head 2 is moved downwardly with respect to the printed circuit board by the drive means 3, resulting in the electronic component held on the suction nozzle 2b coming into contact with the printed circuit board. At this time, the swinging plate 67 is swung in the clockwise direction by the drive means to come to its original condition, during which the swing plate 67 is abutted at its lower portion against the first switching pin 65 to depress the first switching pin 65. Simultaneously with this, the valve member 58 is rotated in the clockwise direction by the predetermined angle, resulting in the first through-hole 61 of the valve member 58 being positionally aligned with the first passageway 59 of the body 56. Thus, the suction nozzle 2b of the mounting head 2 is operatively connected to the air supply source as described above. Then, the air supply source is operated to supply air to the suction nozzle 2b, resulting in the vacuum within the suction nozzle 2b being released, whereby the electronic component is positively and efficiently released from the suction nozzle 2b to be placed on the printed circuit board. After the suction nozzle 2b has placed the electronic component on the printed circuit board, the mounting head 2 is moved upwardly and then returned to its original position.

Thus, it will be noted that the switching means can easily and efficiently carry out selective connecting of the suction nozzle to the air supply source or the vacuum source by causing the valve member 58 to be rotated in the predetermined direction by the predetermined angle.

Figure 9:
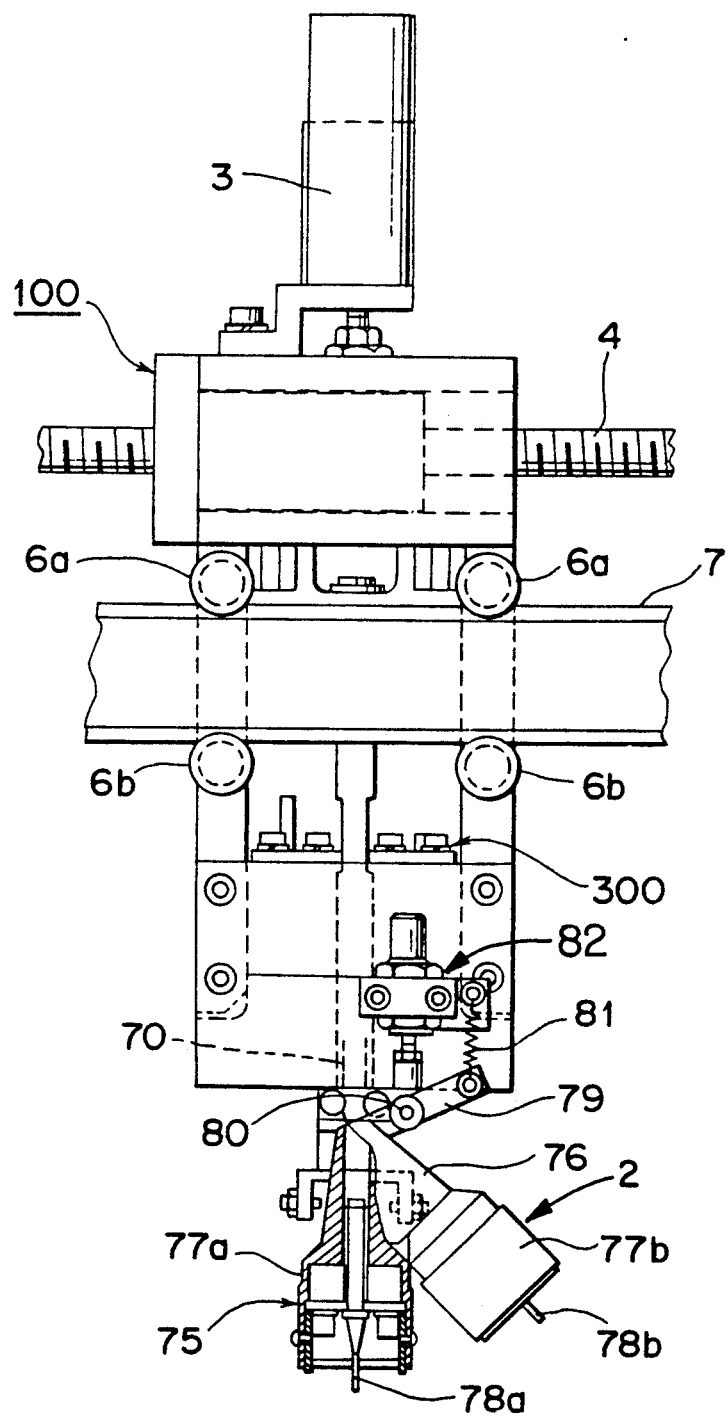
FIG. 9 is a partial cutaway view of a modification of the mounting head of FIG. 8.

A modification of the electronic component mounting mechanism 100 of FIGS. 7 and 8 is shown in FIGS. 9 and 10. This modification employs a mounting head including at least two suction nozzles different in diameter from one another, which suction nozzles are adapted to be switched in a manner to be selectively connected to the switching means 300. In the modification of FIGS. 9 and 10, parts which are identical to those shown in FIGS. 7 and 8 are identified by the same designators and the description of them will not be repeated.

Referring now to FIGS. 9 and 10, the mounting head 2 includes a nozzle holder 75. The nozzle holder 75 includes a bracket portion 76 and at least two cup portions connected to the bracket portion 76 to hang down from the bracket portion 76. In each of the at least two cup portions, a suction nozzle is supported. In the illustrated example, two cup portions 77a, 77b are employed and suction nozzles 78a, 78b are inserted in the cup portions 77a, 77b, respectively. The nozzle holder 75 is connected at its bracket portion 76 to one end portion of an elongate lever arm 79 which is rotatably supported through an axis 80 to the mounting head body 2a. A tension spring 81 is stretched between the other end portion of the lever arm 79 and the mounting head body 2a, by the action of which tension spring 81 one of the suction nozzles or the suction nozzle 78a is adapted to be always aligned with and coupled to the sleeve pipe 70. Above the lever arm 79, a drive cylinder 82 is located. The drive cylinder 82 is mounted on the mounting head body 2a and serves to cause the lever arm 79 to be rotated about the axis 80 against the action of the tension spring 81 in a manner such that the nozzle holder 75 is swung by a predetermined angle. More particularly, when the drive cylinder 82 is actuated to extend its rod and the rod of the cylinder 82 is abutted against the lever arm 79, the lever arm 79 is pivoted on the axis 80, thereby causing the nozzle holder 75 to be swung by the predetermined angle. In the illustrated example, the cup portions 77a and 77b are connected to the bracket portion 76 such that axial lines of the cup portions 77a, 77b extend radially from a connecting point O of the cup portions 77a, 77b with respect to the bracket portion 76 as shown in FIG. 10. An angle between the axial line of the cup portion 77a and the axial line of the cup portion 77b is set to 45 degrees in the illustrated example. Each of the suction nozzles 78a, 78b is located on the axial line of the corresponding cup portion. In the illustrated example, the nozzle holder 75 is adapted to be swung 45 degrees. As described above, the number of the cup portions is two and the number of the suction nozzles is two in the illustrated example. However, it is understood that the number of the cup portions and the number of the suctions nozzles are not limited to two. In the case where more than two cup portions are employed and therefore more than two suction nozzles are employed, the cup portions may be connected to the bracket portion 76 so as to be aligned along the swinging direction of the nozzle holder 75.

In a state shown in FIGS. 9 and 10, the suction nozzle 78a is aligned with and coupled to the sleeve pipe 70 due to the action of the tension spring 81, when it is necessary to cause the suction nozzle 78b different in diameter from the suction nozzle 78a to handle a certain electronic component, the drive cylinder 82 is actuated to extend its rod to cause the lever arm 79 to rotated around the axis 80 against the action of the tension spring 81, whereby the nozzle holder 75 is swung by 45 degrees. This results in the suction nozzle 78b of the cup portion 77b becoming aligned with and coupled to the sleeve pipe 70. Thus, the suction nozzle 78b can carry out holding of an electronic component and releasing the electronic component.

Thus, it will be noted that the mounting mechanism of FIGS. 9 and 10 can easily and speedily handle several types of electronic components.

As described above, when an electronic component is sucked up by the suction nozzle of the mounting head, a picture of the electronic component held on the suction nozzle is picked up by the first optical detection means. In order to facilitate picking-up a sharp picture of an electronic component, lighting means for irradiating light to the electronic component may be employed.

Referring now to FIG. 11, there is shown a mounting head having such lighting means incorporated therein. The mounting head 2 includes a housing member 85 of a substantially cup-shape for supporting lighting means 400 and provided at the lower end portion of the body 2a. The lighting means 400 comprises a light scattering plate 86 for scattering light and fixed on an opened lower end side of the housing member 85, a reflector 87 contained in the housing member 85 and arranged in parallel with the scattering plate 86, and a plurality of light-emitting elements 88, e.g., light emitting diodes mounted on an undersurface of the reflector 87. The light scattering plate 86 may be formed of translucent resin, glass, ceramic materials or the like. The suction nozzle 2b hangs down from a sleeve pipe (identical to the sleeve pipe 70 in FIGS. 7 and 9) to penetrate the reflector 87 and the light scattering plate 86. In FIG. 11, a reference numeral 89 denotes a picture picking-up means, e.g., a CCD camera or the like. The picture picking-up means 89 is arranged in a manner to be aligned with an axial line of the suction nozzle 2b, so that the picture picking-up means 89 can precisely pick-up a picture of an electronic component when it is held on the suction nozzle 2b.

In the lighting means 400 constructed as described above, light emitted from the light-emitting elements 88 are reflected from the reflector 87, and then scattered by means of the light scattering plate 86, resulting light rays being irradiated toward an electronic component E held on the suction nozzle 2b. At this time, the light irradiated toward the electric component, passes by the electronic component, whereby a black picture of the electronic component is picked up by the picture picking-up means 89.

Thus, it will be noted that the lighting means makes it possible for the picture picking-up means to pick up a sharp black picture of an electronic component in a state when it is held on the suction nozzle.

In order to successively mount various kinds of electronic components on a printed circuit board, the automatic mounting apparatus according to the present invention may include a plurality of mounting mechanisms.

Figure 12:
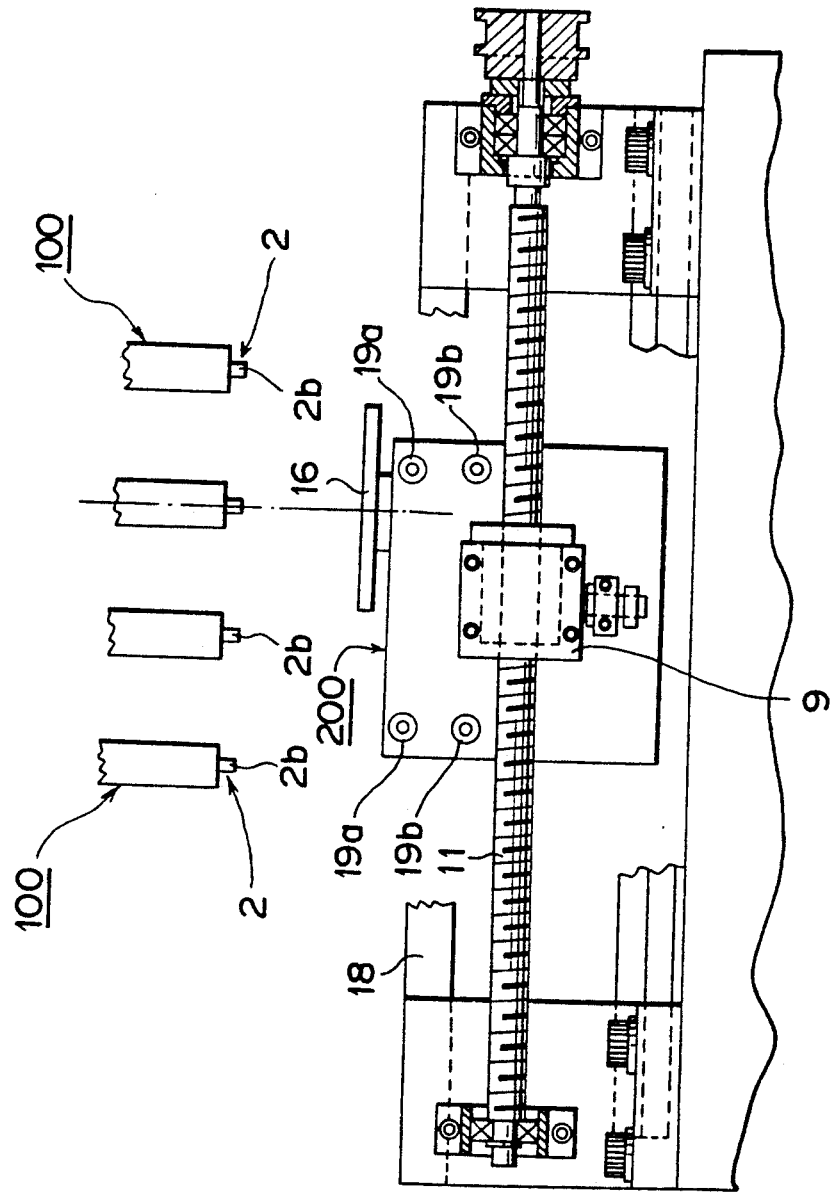
FIG. 12 is a front view of an electronic component mounting apparatus having a plurality of mounting heads.

One example of an automatic electronic component mounting apparatus having a plurality of mounting mechanisms described in connection with FIG. 2 is shown in FIG. 12. In the example shown in FIG. 12, parts which are similar to those shown in FIGS. 2 to 4 are identified by the same designators and the description of them will not be repeated.

Referring to FIG. 12, mounting heads 2 of the mounting mechanism 100 are adapted to be moved in the Y direction by the drive means as described above separately. A printed circuit board is carried on the table 16 of the printed circuit board supporting mechanism 200 which is adapted to be moved in the X direction and turned in the θ direction. In the illustrated example, an electronic component supply unit having a plurality of electronic component supply mechanisms incorporated therein is employed. The electronic component supply unit is adapted to be moved in the X direction. The electronic component supply mechanisms are adapted to supply different types of electronic components.

Figure 13:
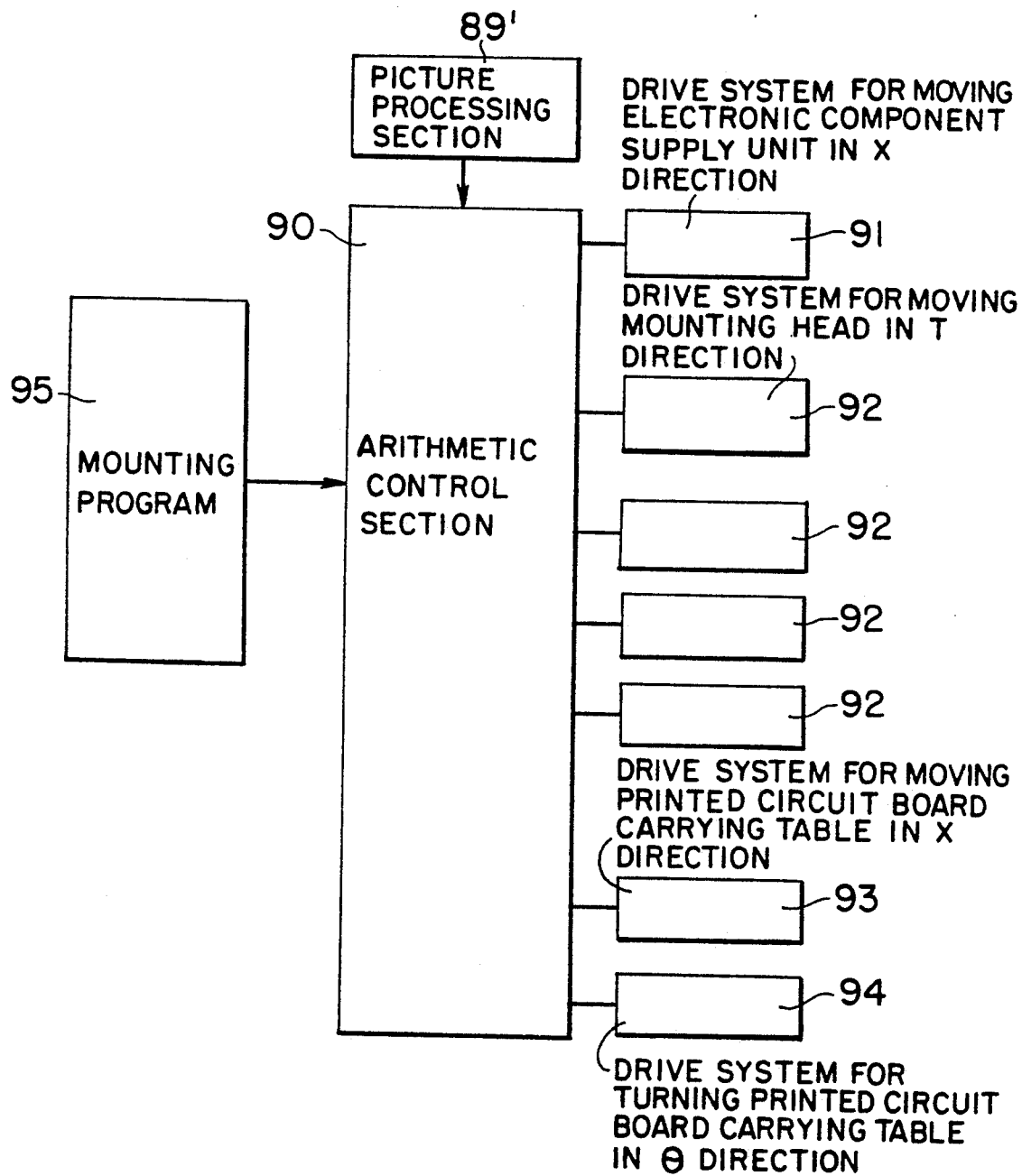
FIGS. 13 and 14 are each a schematic view showing a method of randomly mounting electronic components a printed circuit board according to the present invention.
Figure 14:
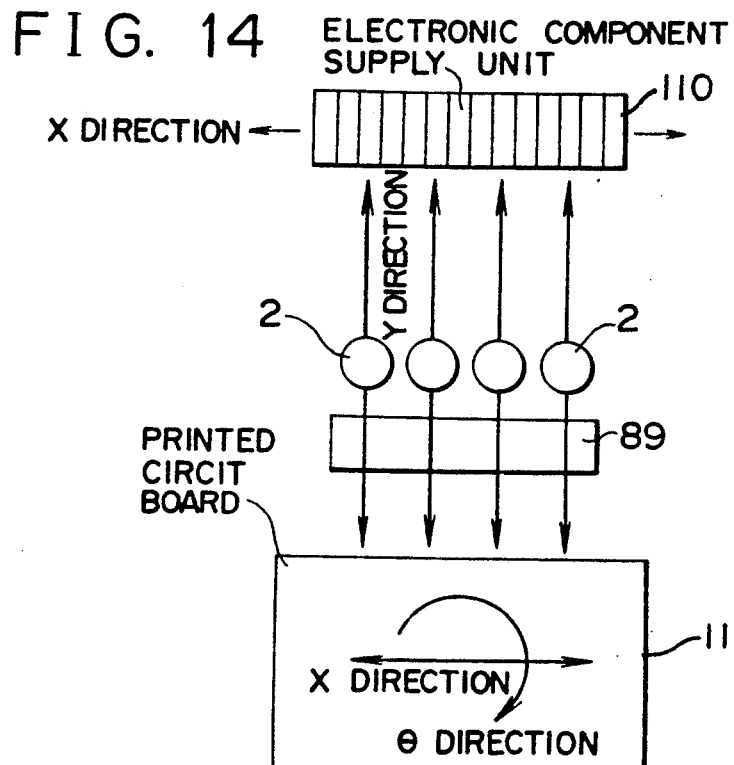

FIG. 13 is a block diagram showing a control system for controlling respective mechanisms of the automatic mounting apparatus of FIG. 12, in which a reference numeral 89' designates a picture processing section and a reference numeral 90 designates an arithmetic control section. The picture processing section 89' is arranged at the moving paths of the mounting heads 2 as shown in FIG. 14, and adapted to output picture data on a state of an electronic component sucked on each suction nozzle and leads of the electronic component (if the component is of a lead-type). The arithmetic control section 90 is adapted to control a drive system 91 for moving the electronic component supply unit in the X direction, a plurality of drive systems 92 for separately moving the mounting heads in the Y direction, a drive system 93 for moving a printed circuit board carrying table in the X direction, and a drive system 94 for turning a printed circuit board in the θ direction, depending upon a mounting program 95 and picture data sent from the picture processing section 89'. Also, the arithmetic control section 90 is adapted to receive data on an X directional position of each electronic component supply mechanism from the drive system 91, data on a Y directional position of each mounting head from the drive system 92, and data on an X directional position and a θ directional angular position of a printed circuit board.

Now, a method of mounting electronic components on a printed circuit board which is performed by the automatic mounting apparatus of FIG. 12 will be described.

In a conventional mounting method, when mounting of electronic components on a printed circuit board is carried out by separately moving a plurality of mounting heads, mounting order of electronic components is specified according to a mounting program, and the operation of the mounting mechanisms depends on the program made by an operator. Therefore, there is a possibility that an idle operation of the mechanisms will occur due to an operator's error. Now, a conventional mounting program is shown in table I.

TABLE I

| Step Number | X | Y | θ | Component Number | Mounting Head Number |
|---|---|---|---|---|---|
| 1 | 500 | 300 | 0 | 15 | 4 |
| 2 | −100 | 200 | 0 | 9 | 2 |
| 3 | 200 | 300 | 90 | 15 | 4 |
| 4 | 200 | 300 | 0 | 14 | 4 |

In Table I, Step Number indicates a mounting order of electronic components, X and Y indicate an electronic component mounting position, θ indicates a rotational angle of an electronic component, Component Number indicates a kind of an electronic component to be supplied from the electronic component supply unit 110 shown in FIG. 14, and Mounting Head Number indicates a mounting head directed to carry out mounting operation.

When an operator makes the mounting program shown in Table I and starts the automatic mounting apparatus to carry out the mounting operation according to the mounting program, mounting order of electronic components and selection of mounting heads specified in Table I may not be always most suitable, so that this may cause the mounting heads to have a great deal of idle waiting time. This will lower the efficiency of the mounting operation.

In view of the above, in the method of mounting electronic components on a printed circuit board according to the present invention, the selection of the most efficient mounting order of electronic components is performed in the arithmetic control section 90, without specifying the Step Number and Mounting Head Number in a mounting program to be prepared by an operator as will be seen from Tables II and III shown hereinafter. More particularly, in the mounting method according to the present invention, the mounting of electronic components on a printed circuit board 111 is performed by always taking into consideration positions of electronic components in the electronic component supply section (or time required for desired electronic components to reach a condition to be sucked up by the mounting heads 2), the condition of actuation of each mounting head (or the present position of each mounting head), results of checking of picture data sent from the picture processing section 89' (or results of checking whether the condition of electronic components held on the suction nozzles is proper or improper and results of checking leads of the electronic components) and electronic component mounting positions (X, Y, θ) of a printed circuit board, to firstly select one of electronic components specified to be mounted on a printed circuit board according to the mounting program 95, which electronic component is regarded as that having the least idle waiting time with reference to the mounting heads, to mount the electronic component on the printed circuit board, and the next select one of the remaining electronic components in order which is regarded as that having the least idle waiting time with reference to the mounting heads, to mount the electronic component on the printed circuit board. Also, when the condition of an electronic component held on a suction nozzle is determined to be improper by checking picture data sent from the picture processing section 89', the mounting operation is carried out by selecting an electronic component having the least waiting time with reference to the mounting heads at this time to mount the electronic component on the printed circuit board. This does not mean that replacement of an improper electronic component by a new electronic component is preferentially carried out, but means that movement of the mounting heads at that time is efficiently controlled.

Mounting programs employed for performing the mounting method of the present invention are shown in Table II and III.

TABLE II

| X | Y | θ | Component Number |
|---|---|---|---|
| 500 | 300 | 0 | 15 |
| −100 | 200 | 0 | 9 |
| 200 | 300 | 90 | 15 |
| 200 | 350 | 0 | 14 |

TABLE III

| X | Y | θ | Component Number |
|---|---|---|---|
| 200 | 300 | 90 | 15 |
| 200 | 350 | 0 | 14 |
| 500 | 300 | 0 | 15 |
| −100 | 200 | 0 | 9 |

Comparison between Tables II and III indicates that the same operation is carried out in either case, so that the efficiency of the mounting operation does not depend on whether a mounting program prepared by an operator is proper or improper.

As described above, in the random mounting method according to the present invention, a plurality of the mounting heads are adapted to be randomly moved separately and controlled in a manner not to be idly actuated, so that it is possible to increase the efficiency of the mounting operation. In addition, mounting order of electronic components is determined by the automatic mounting apparatus. This will bring about simplification of a mounting program to be prepared by an operator.

Figure 15:
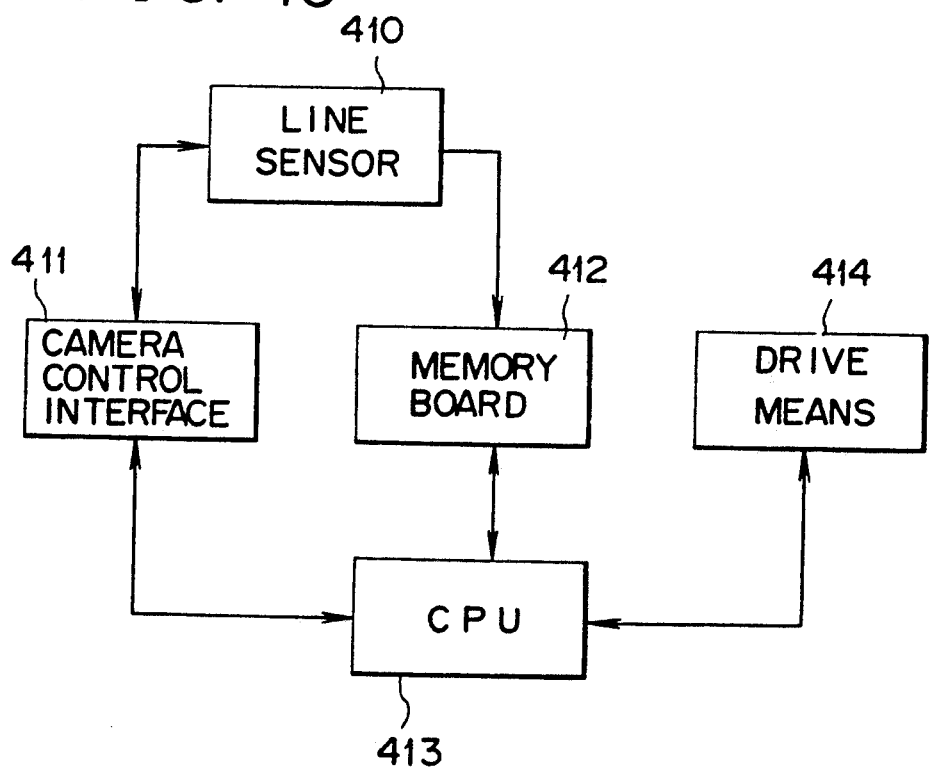
FIG. 15 is a schematic view showing to step of picking-up a picture of a component.

Referring to FIG. 15, there is shown a manner of picking-up a picture of an electronic component held by a suction nozzle of a mounting head. In FIG. 15, a reference numeral 410 denotes a line sensor having resolving power and including a CCD, a reference numeral 411 designates a camera control interface directly controlling the line sensor 410 and preparing command signals for causing the line sensor 410 to output one-dimensional image signals (time series signals). Arranging direction of one-dimentional visual field of the line sensor 410 is the x-direction. In FIG. 15, a reference numeral 412 designates a memory board which serves as means to store therein one-dimensional image signals outputted by the line sensor 410, a reference numeral 413 denotes a CPU, and a reference numeral 414 designates drive means for moving a mounting head holding an electronic component in the Y direction perpendicular to the arranging direction of one-dimensional visual field. The CPU 413 serves as means to control the cycle of the output of one-dimensional image signals by the line sensor 410, travel speed of the mounting head moved by the drive means 414 and operation of the memory board 412.

When the mounting head holding an electronic component is moved at a uniform rate or intermittently in the Y direction, synchronously with the movement of the mounting head the line sensor 410 periodically receives command signals through the camera control interface 411 to input one-dimensional image signals in order to the memory board 412, resulting in the X directional one-dimensional image signals in which the Y- coordinate of the electronic component held by the mounting head is deviated by slight distances being in order sent to the memory board 412. When the whole electronic component passes the visual field of the line sensor 410, two-dimensional image of the electronic component is obtained by the memory board 412.

Another embodiment of a method of mounting an electronic component on a printed circuit board will be described hereinafter with reference to FIGS. 16 and 17.

Figure 16:
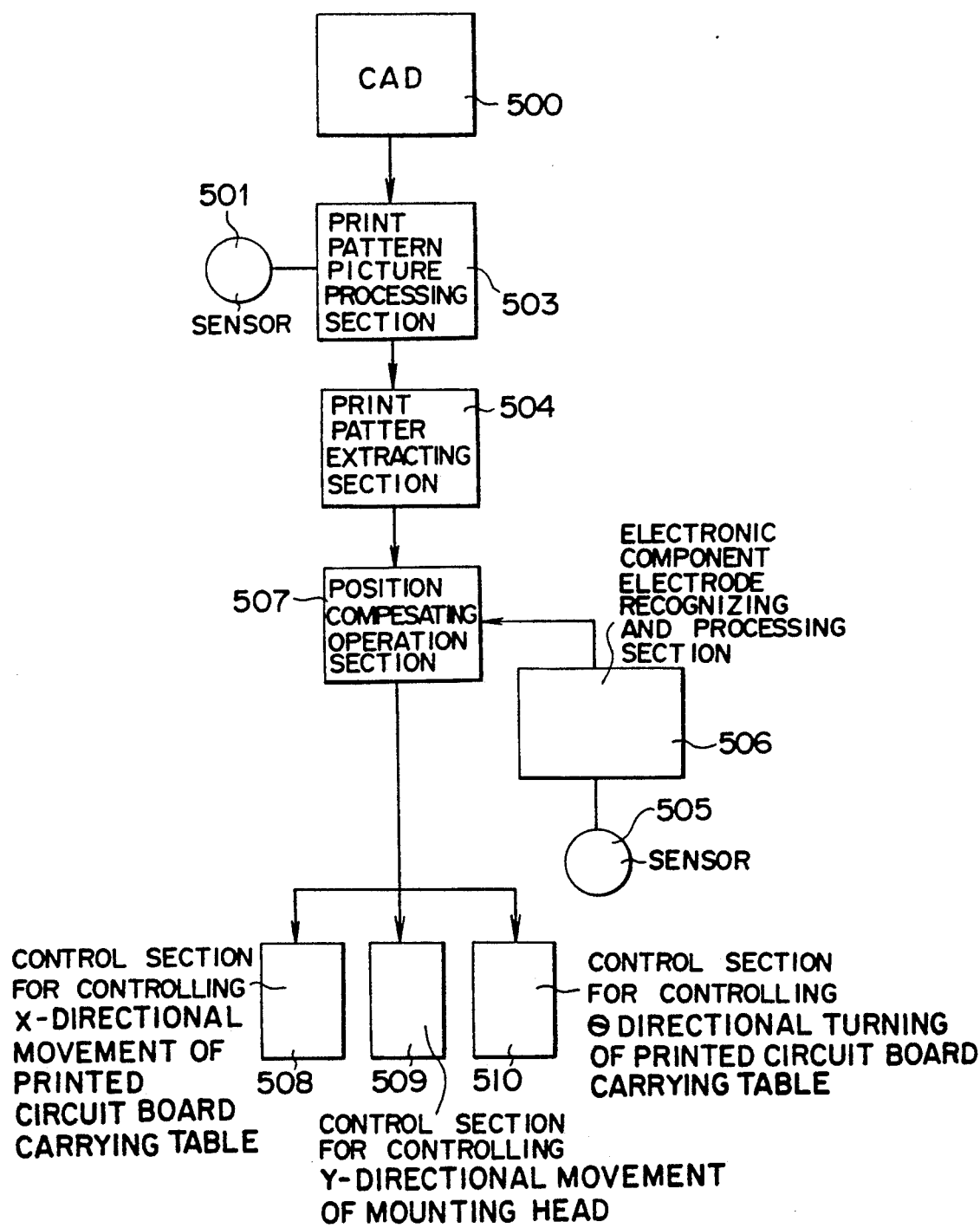
FIGS. 16 and 17 are each a schematic view of a mounting apparatus for performing another method of mounting electronic components on a printed circuit board.
Figure 17:
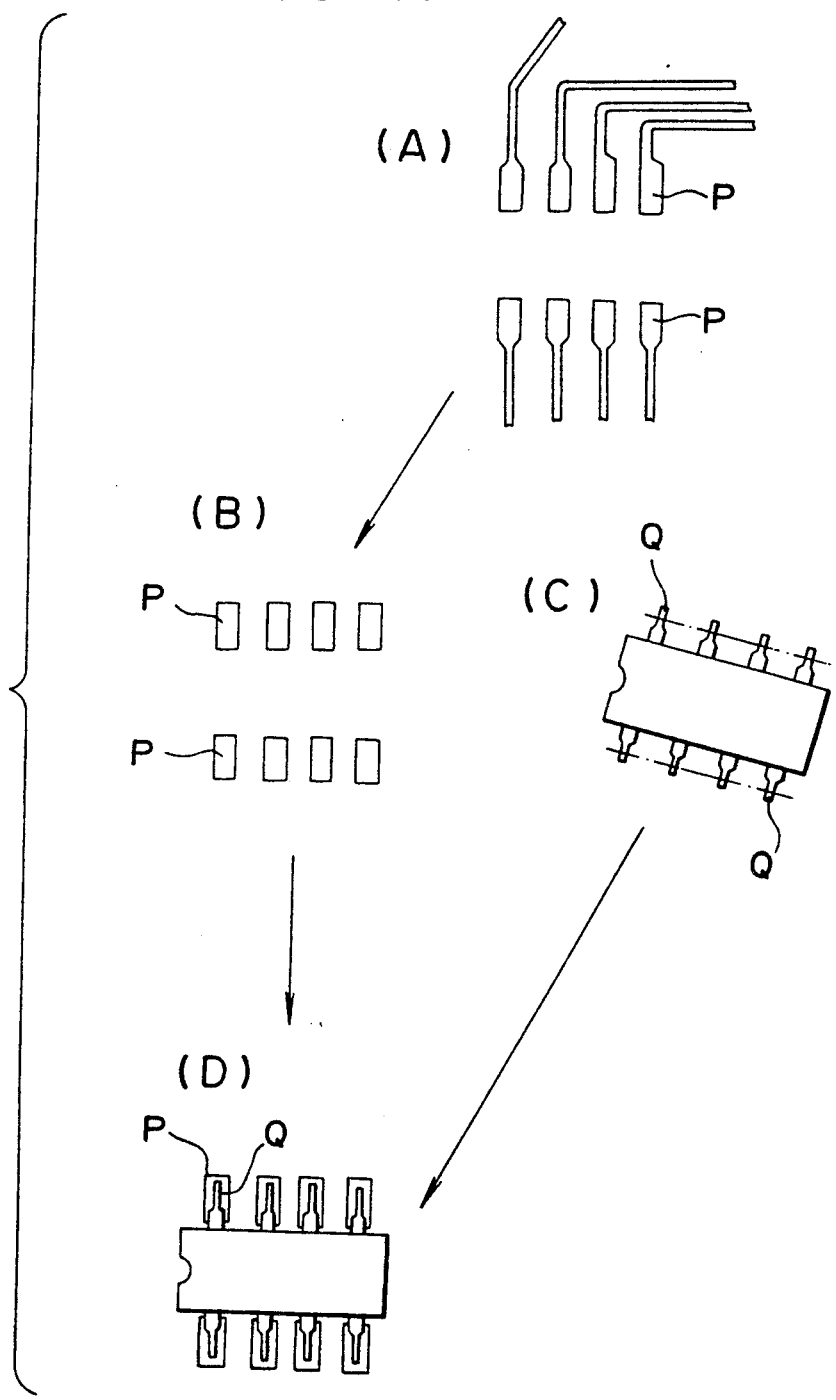

In FIG. 16, a reference numeral 500 designates a CAD which serves as means to automatically set a position of a print pattern on a printed circuit board and an electronic component mounting position by inputting data on requirements for constituting a circuit, e.g., the area of a printed circuit, a kind of an electronic component, and the number of electronic components depending on a circuit diagram. Data on a position of a print pattern and a shape of a print pattern are extracted from the CAD 500. Then, pictures of necessary portions of a print pattern on an actual printed circuit board are picked up by means of an optical sensor 501 such as a camera, depending upon the data extracted from the CAD, whereby image data on necessary portions of the print pattern as shown in FIG. 17 (A) are obtained by a print pattern picture processing section 503. Thereafter, a print pattern picture extracting section 504 extracts pictures P of only electrode portions, on which an electronic component is to be mounted or pictures of portions of the print pattern on which electrode portions of an electronic component to be mounted are superposed, as shown in FIG. 17 (B), depending upon the picture data shown in FIG. 17 (A).

Pictures of electrodes of an electronic component held by a suction nozzle are picked up by means of an optical sensor 505 such as a camera. Then, pictures Q of the electrodes of the electronic component are processed by means of an electronic component electrode recognizing and processing section 506 to be recognized as shown in FIG. 17 (C).

A position compensating operation section 507 receives picture data on the electrode portions P of the print pattern which are extracted as shown in FIG. 17(B) by the print pattern picture extracting section 504, and picture data on the electrode portions Q of the electronic component which are extracted as shown in FIG. 17(C) by the electronic component electrode recognizing and processing section 506. Then a position compensating operation section 507 performs an arithmetic operation in order to compensate a mounting position of the electronic component in such a manner that all of the pictures Q of the electrodes of the electronic component are superposed on the respective extracted pictures P of the print pattern, and outputs compensation data are obtained by the arithmetic operation at a control section 508 for controlling the X directional movement of the printed circuit board carrying table, a control section 509 for controlling the Y directional movement of the mounting head, and a control section 510 for controlling the θ directional rotation of the table. Depending upon the above described data, the control section 508 changes an X-axis directional position of the printed circuit board carrying table relative to a position of the mounting head, the control section 509 changes a Y-axis directional position of the mounting head relative to the printed circuit board carrying table, and the control section 510 changes a θ directional position of the table, thereby bringing the electronic component to the state in which all the electrodes Q thereof are aligned with the respective portions of the print pattern of the printed circuit board, to carry out the mounting operation of the electronic component on the print pattern of the printed circuit board.

Figure 18:
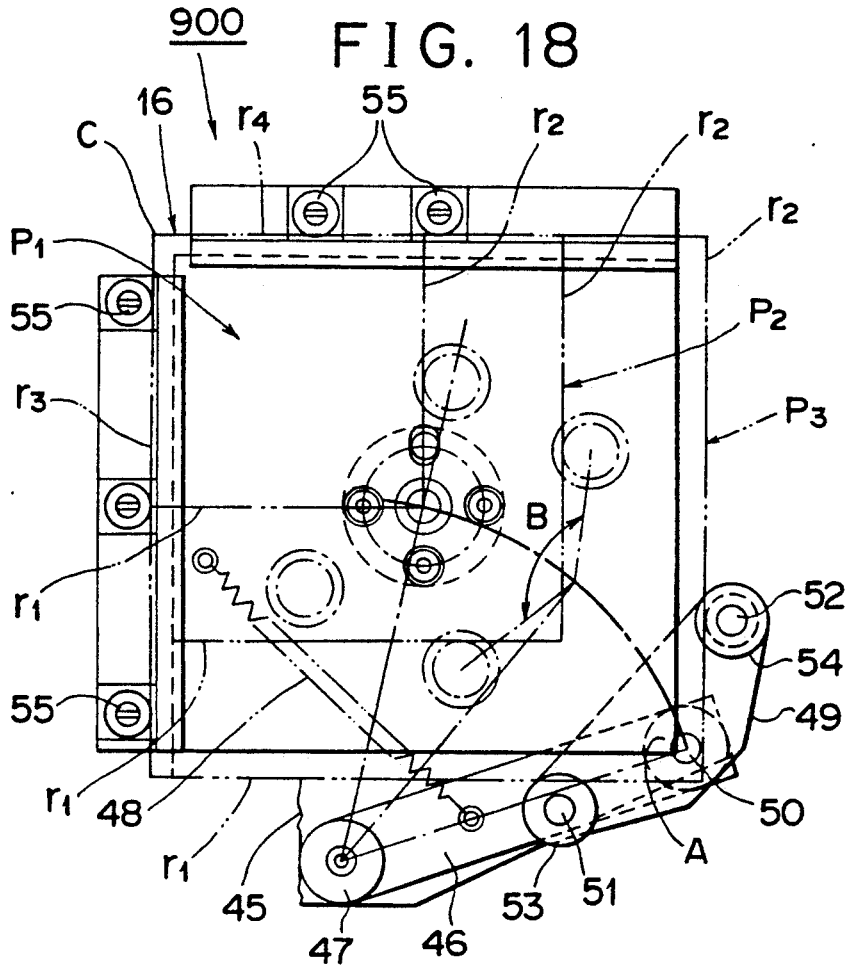
FIG. 18 is a plan view of a modification of the printed circuit board supporting mechanism.
Figure 19:
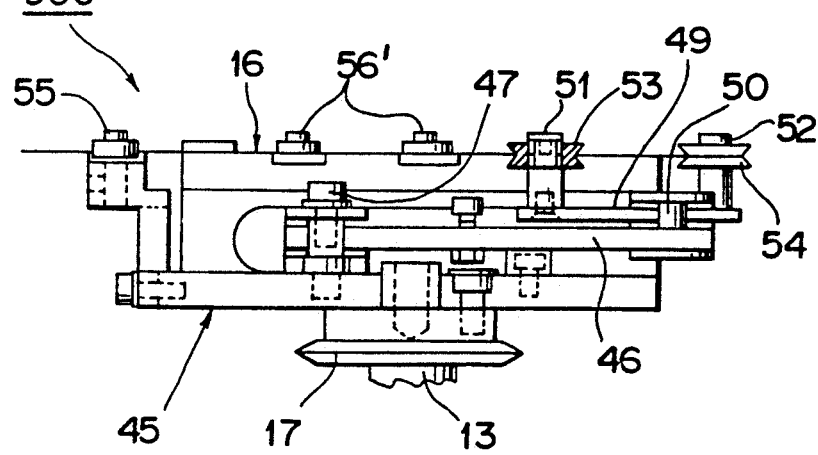
FIG. 19 is a side view of the supporting mechanism of FIG. 18.

The printed circuit board supporting mechanism 200 shown in FIGS. 3 and 4 may include a printed circuit board positioning mechanism. The printed circuit board positioning mechanism 900 is shown in FIGS. 18 and 19. In FIGS. 18 and 19, parts which are identical to those shown in FIGS. 3 and 4 are identified by the same designators and the description of then will not be repeated.

Referring now to FIGS. 18 and 19, the table 16 is adapted to position a printed circuit board of a substantially square-plate shape thereon as will be described later. In the illustrated embodiment, even though printed circuit boards P1, P2 and P3 different in size from one another as shown in FIG. 18 are employed, all of them may be positioned on the table 16. The table 16 is formed into a substantially square plate-like shape and horizontally supported by a support plate 45 which is projected laterally from the side plate 10 (See FIG. 3) and connected through the disk-like guide 17 to the upper end of the rotating shaft 13. In FIGS. 18 and 19, a reference numeral 46 designates an elongate lever arm. The lever arm 46 is located under the table 16 and pivotally connected through a vertical axis 47 at its one end to the support plate 45 to horizontally extend in a such manner that the other free end thereof is located under one corner portion A in the square-shaped table 16. A tension spring 48 is stretched between the approximately middle portion of the longitudinal direction of the lever arm 46 and a predetermined portion of the undersurface of the table 16, so that the lever arm 46 is always urged by the tension spring 48 in a manner to pivot on the axis 47 in a counterclockwise direction. Such pivotal movement of the lever arm 46 is adapted to be prevented by locking means (not shown) for locking the lever arm 46 against the action of the tension spring 48 to prevent the pivotal movement of the lever arm 46. The locking means is adapted to receive a command from a computer as required to release the lever arm 46 therefrom. Instead of the tension spring 48, a drive cylinder may be employed. In the case where the drive cylinder is employed, the drive cylinder is connected to the lever arm 46 in order to actuate the lever arm 46 to be pivotally moved about the axis 47 as required. The lever arm 46 has a horizontally holding plate 49 which is located above the lever arm 46 and is pivotally connected through a vertical axis 50 at its approximately middle portion to the free end portion of the lever arm 46. The horizontally holding plate 49 has two vertical axes 51,52 provided at its both end portions so as to project upwardly from the holding plate 49, a first holding roller 53 rotatably supported to an upper end portion of the vertical axis 51, and a second holding roller 54 rotatably supported to an upper end portion of the vertical axis 52, each of holding rollers 53,54 having a circumferential groove of a substantially V-shape. When the lever arm 46 is pivotally moved in the counterclockwise direction by the action of the tension spring 48, the first and second holding rollers 53,54 are moved while being guided by guide passages formed in the table 16. More particularly, the table 16 has a first guide passage (not shown) formed therein to extend correspondingly to a moving route of the holding roller 53, and a second guide passage (not shown) formed therein to extend correspondingly to a moving route of the holding roller 54. The holding rollers 53,54 are supported to the axes 51,52 so that they are engaged with the first and second guide passages, respectively. Also, the upper half of each of the holding rollers 53,54 projects through the corresponding guide passage upwardly from the table 16. When the lever arm 46 is pivotally moved in the counterclockwise by the action of the tension spring 48, the first and second holding rollers 53,54 are moved while being guided by the first and second guide passages, respectively, to be respectively abutted against two sides r1, r2 of the printed circuit board P1, (or P2 or P3) which extend perpendicularly to each other, whereby the printed circuit board is pushed by the holding rollers 53,54 toward a corner C of the table 16 which is opposite to the corner A of the table 16 in a diagonal direction. In order that the first and second holding rollers 53,54 may be securely abutted against the two sides r1,r2 of the printed circuit board P1 (or P2 or P3), respectively, the first and second holding rollers 53,54 are arranged in a manner to be separate from each other at a predetermined obtuse angle B about a pivotal connecting point between the lever arm 46 and the holding plate 49. Arranged along two side of the table 16, which form the corner C of the table 16, are regulating rollers 55 for holding the remaining sides r3, r4 of the printed circuit board pushed by the holding rollers 53,54 to position the printed circuit board on the table 16 in cooperation with the holding rollers 53,54. Each of the regulating rollers 55 is preferably formed such that at least circumferential portion thereof is formed of the same materials as the printed circuit board, e.g., ceramic materials such as alumina, thereby minimizing wear of the regulating roller 55. Also, the regulating rollers 55 may be supported through bearings to the vertical axes which are supported by the table 16 along the sides r3,r4 of the table 16, thereby minimizing wear of the regulating rollers 55 which may occur when the regulating rollers 55 position the printed circuit board on the table 16 in cooperation with the holding rollers 53,54.

In the printed circuit board positioning mechanism 900 constructed as described above, when the mounting operation of electronic components is carried out, a printed circuit board is adapted to be loaded on the table 16 from a right direction in FIG. 18, and when the mounting operation is completed, the printed circuit board having the electronic components mounted thereon is adapted to be discharged in the right direction for recovery. In a state of the lever arm 46 being locked by the locking means as shown in FIG. 18, when a printed circuit board is loaded on the table 16, the locking means receives a command from the computer to release the lever arm 46, resulting in the lever arm 46 being pivotally moved in the counteclockwise direction about the axis 47 due to the action of tension spring 48. The pivotal movement of the lever arm 46 causes each of the holding rollers 53,54 to be moved along the corresponding guide passage, resulting in that the holding rollers 53,54 will abut against sides r1,r2 of the printed circuit board to push the printed circuit board toward the corner C of the table 16. This results in the remaining sides r3, r4 of the printed circuit board being held by the regulating rollers 55. Thus, the printed circuit board is positioned on the table 16 by cooperation of the holding rollers 53,54 and the regulating rollers 55. Incidentally, each of the holding rollers 53,54 has the circumferential groove of a substantially V-shape as described above, so that when the holding rollers 53, 54 are abutted against the sides r1, r2 of the prented circuit board, respectively, the holding rollers 53, 54 can receive through their V-shaped grooves edges of the sides r1, r2 of the printed circuit board, respectively, whereby the printed circuit board is securely held by the holding rollers 53, 54. After the printed circuit board has been positioned on the table 16 in the manner as described above, the mounting head 2 mounts an electronic component on the printed circuit board. When the mounting operation of a predetermined number of electronic components on the printed circuit board is completed, the locking means receives a command from the computer to cause the lever arm 46 to be pivotally moved in a clockwise direction about the axis 47 against the action of the tension spring 48, resulting in the release of the printed circuit board from the holding rollers 53, 54. Then, the printed circuit board having the electronic component mounted thereon is discharged for recovery as described above.

Thus, it will be noted that even though a plurality of printed circuits boards different in size from one another are employed, the printed circuit board positioning mechanism 900 can easily and efficiently carry out the positioning of all of such printed circuit boards.

Figure 20:
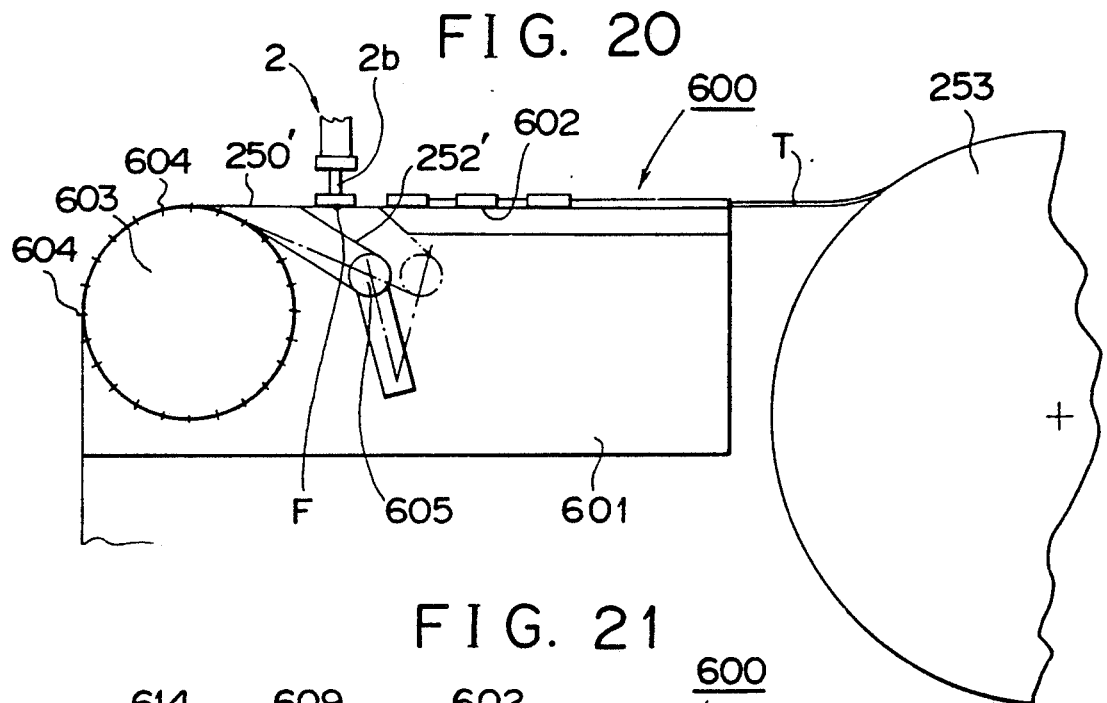
FIGS. 20 and 21 are each a schematic side view of an electronic component supply mechanism.
Figure 21:
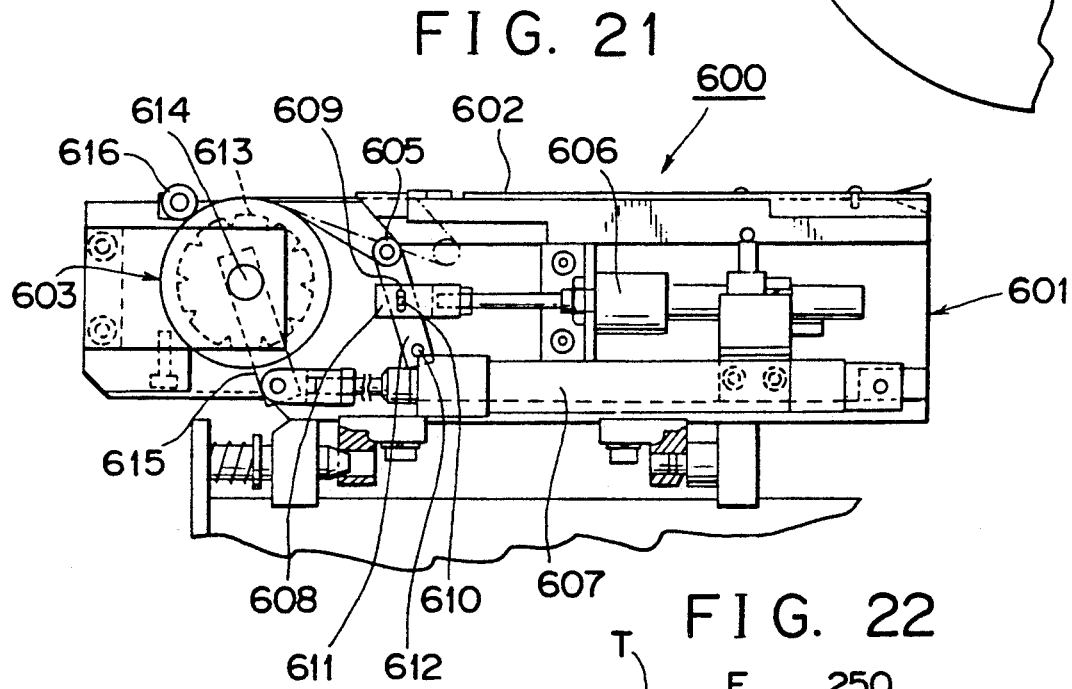
Figure 22:
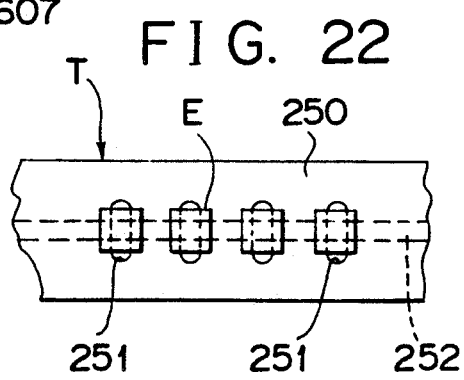
FIG. 22 is a partial, plan view of an electronic component series tape which is treated by the electronic component supply mechanism.

As one example of the electronic component supply mechanism briefly described above, a tape feeder for feeding an electronic component series tape is shown in FIGS. 20 and 21. One example of the electronic component series tapes which are treated by the tape feeder of FIGS. 20 and 21 is shown in FIG. 22. The electronic component series tape T comprises a carrier tape 250 having a plurality of openings 251 formed at equal intervals along the longitudinal direction of the carrier tape 250 and a plurality of feeding perforations (not shown) formed at the edge portion of the carrier tape 250 along the longitudinal direction of the carrier tape 250, an adhesive tape 252 of a width less than that of the carrier tape 250 and stuck on the back of the carrier tape 250 in a manner to extend along a row of the openings 251, and a plurality of electronic components E arranged on the respective openings 251 to be held on the upper surface of the carrier tape 250 through portions of the adhesive tape, which are exposed from the openings of the carrier tape 250. The tape T is wound around a reel.

Referring now to FIG. 20, the reel 253 having the electronic component series tape T wound therearound, when it is used, is installed in a mounting apparatus. The tape feeder 600 comprises a body 601 and tape traveling passage means 602 mounted on the body 601. A mounting head 2 is located above an electronic component supply position F on the tape travelling passage means 602 and is moved downwardly with respect to the electronic component supply position F, when one of the electronic component E held on the carrier tape 250 is fed to the electronic component supply position F, to hold the electronic component through its suction nozzle 2b. After the suction nozzle 2b holds the electronic component via vacuum, the mounting head 2 is moved upwardly to remove the electronic component from the carrier tape 250 through the suction nozzle 2b. In advance of the tape travelling passage means 602, a tape feed drum 603 is located. The tape feed drum 603 is provided on the circumferential surface thereof with a plurality of projecting teeth 604 which are operatively engaged with the non-shown feeding perforations of the carrier tape 250 to feed the electronic component series tape T from the reel 253 upon in rotation of the tape feed drum 603. In FIG. 20, a reference numeral 605 for peeling adhesive tape 252 from the carrier tape 250 denotes a tension roller 605 which is located under the tape travelling passage means 602.

Referring to FIG. 21, the tape feeder 600 further includes a first drive cylinder 606 and a second drive cylinder 607 which are located under the tape travelling passage means 602 to extend in a horizontal direction and supported to the body 601. Mounted on a tip end of the rod of the first drive cylinder 606, is a bracket plate 608 having a vertically elongated hole 609 with which a supporting axis 610, secured to a middle portion of a link bar 611, is engaged. A lower end portion of the link bar 611 is pivotally connected through an axis 612 to the body 601. The tension roller 605 is rotatably supported through an axis to an upper end portion of link bar 611. The tape feed drum 603 is assembled together with a ratchet wheel 613. The assembly of the tape feed drum 603 and the ratchet wheel 613 is secured to a supporting axis 614 which is rotatably supported to the body 601. The supporting axis 614 is connected through a link bar 615 to a tip end of the rod of the second drive cylinder 607. In FIG. 21, a reference numeral 616 designates a pressure roller for again sticking the portion 252' of the adhesive tape 252, which is peeled from the carrier tape 250 by means of the tension roller 605 onto the empty portion 250' of the carrier tape 250.

Incidentally, an initial end portion of the electronic component series tape T wound around the reel 253 has no electronic components. Setting of the electronic component series T in the tape feeder 600 is carried out by unwinding the tape T from the reel 253 to pull the tape T forwardly, peeling an initial portion of the adhesive tape 252 from an initial portion of the carrier tape 250 to cause the initial portion of the adhesive tape 252 to pass under the tension roller 605 from the backward side of the tension roller 605, and causing the initial portion of the carrier tape to be again stuck onto the initial portion of the adhesive tape 252 to engage the feeding perforations of the initial portion of the carrier tape 250 with the projecting teeth 604. In the tape feeder 600 having the electronic component series tape T set therein in the manner as described above, when the second drive cylinder 607 is actuated to retract its rod, thereby causing the tape feed drum 603 to be rotated in a counterclockwise direction by a predetermined angle, the tape T is unwound from the reel 253 by a predetermined length to be fed forward. Synchronously with the forward feeding of the tape T, the mounting head 2 is moved downwardly to suck through the suction nozzle 2b thereof an electronic component reaching the electronic component supply position F. At this time, synchronously with this movement of the mounting head 2, the first drive cylinder 606 is actuated to cause the link bar to be rotated in a clockwise direction by a predetermined angle, whereby the adhesive tape 252 is pulled in the backward of the electronic component supply position F. As a result, a portion 252' of the adhesive tape 252 which adhers to a bottom surface of the electronic component held on the suction nozzle 2b is peeled from the electronic component due to the pulling of the adhesive tape 252 by the tension roller 605, so that when the mounting head 2 is moved upwardly the suction nozzle 2b can easily remove the electronic component from the carrier tape. A portion 250' of the carrier tape 250, from which the electronic component is removed by the suction nozzle 2b, is fed forward with intermittent rotation of the top feed drum 603, which is performed by the actuation of the second drive cylinder 607, together with the portion 252' of the adhesive tape 252 to be discharged in a state in which it is stuck to the portion 252' of the adhesive tape 252. As described above, the tension roller 605 serves to peel a portion of the adhesive tape 252 from the carrier tape 250, when an electronic component is sucked up by the suction nozzle 2b, to cause the peeled portion of the adhesive tape 252 to pass thereunder. Accordingly, the tension roller 605 is preferably constructed such that a periphery of the roller 605 is coated with, e.g., silicon rubber material, in order to facilitate releasing of the adhesive tape portion passing under the roller 605.

As described above, in the tape feeder constructed above, when the suction nozzle holds an electronic component via suction, a portion of the adhesive tape which holds the electronic component via adhesion is peeled from the corresponding portion of the carrier tape by means of the tension roller 605 and thereafter is discharged in a state in which it is stuck to an empty portion of the carrier tape by rotation of the tape feed drum, so that it is possible to avoid the trouble of disposing of the adhesive tape and the empty carrier tape separately. Also, when an electronic component is to be removed from the carrier tape by the suction nozzle, a portion of the adhesive tape which holds the electronic component via adhesion is peeled from the carrier tape by means of the tension roller, so that the removing operation of the electronic component from the carrier tape is easily performed.

Figure 23:
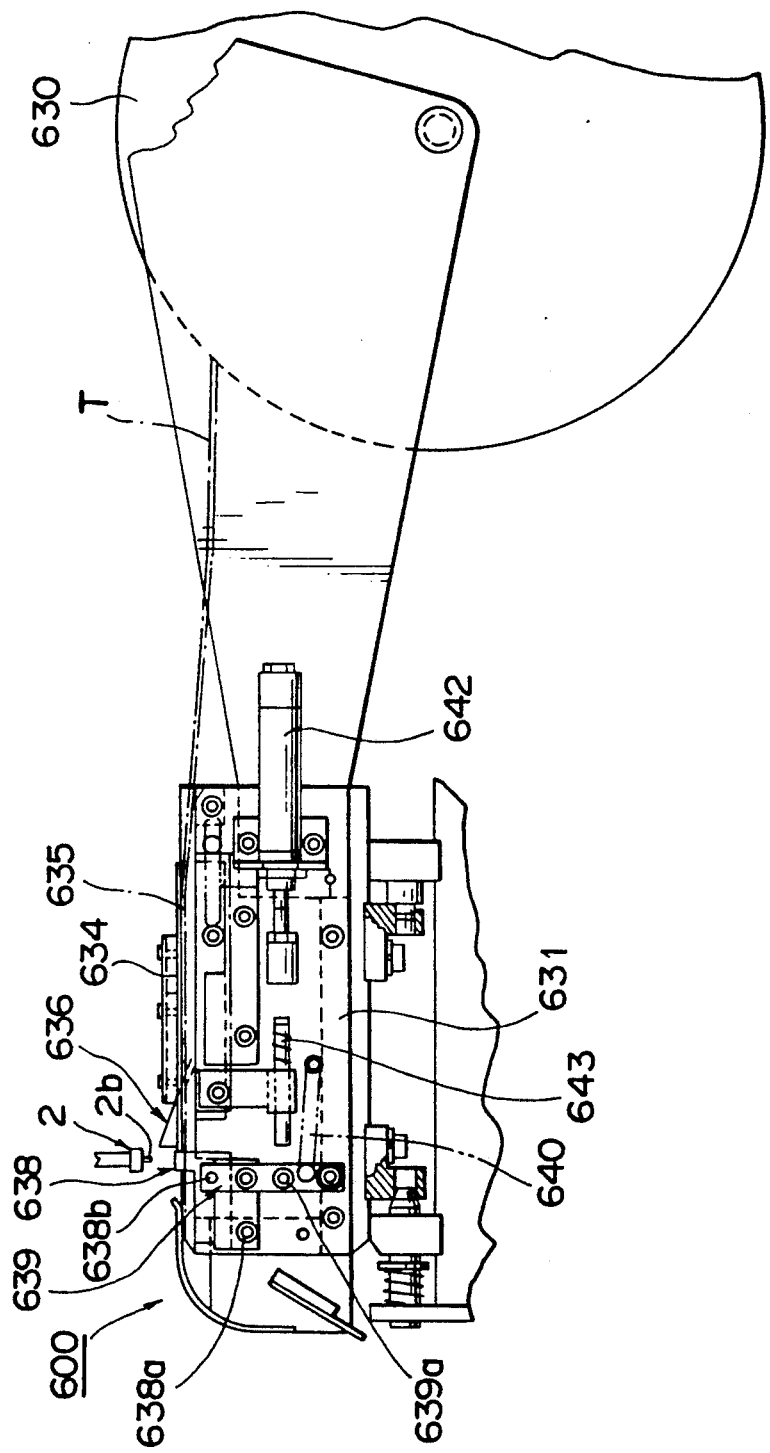
FIG. 23 is a side view of a modification of the electronic component supply mechanism shown in FIG. 20.
Figure 24:
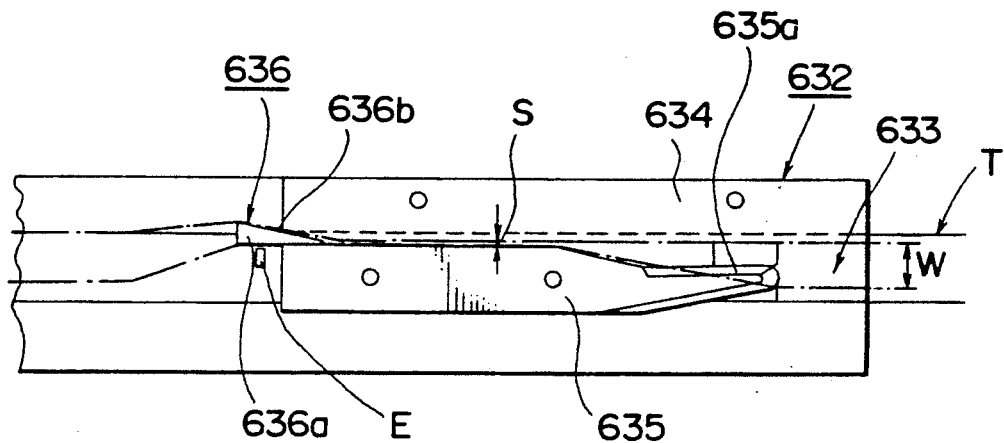
FIG. 24 is a schematic partial plan view of the electronic component supply mechanism of FIG. 23.
Figure 25:
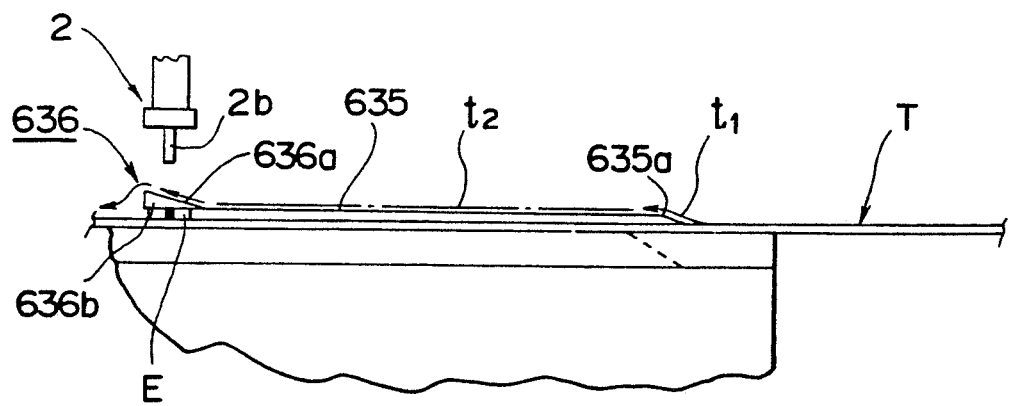
FIG. 25 is a partial side view of the electronic component supply mechanism.

Referring to FIG. 23 to 25, there is shown another example of a tape feeder. An electronic component series tape treated by this tape feeder comprises a carrier tape having a plurality of concave portions spaced at equal intervals along the longitudinal direction of the carrier tape to form hollows for receiving electronic components therein, and feeding perforations, each of the concave portions being swelled downwardly from the carrier tape surface, electronic components received in the respective concave portions, and a cover tape stuck onto an upper surface of the carrier tape through adhesives to cover the respective concave portions. This electronic component series tape is wound around a reel 630. The reel 630 having the electronic component series tape T wound therearound, when it is used, is installed in a mounting apparatus.

The tape feeder 600 comprises a body 631 and elongate tape travelling passage means 632 mounted on the body 631 and having a groove 633 extending in the longitudinal direction of the tape travelling passage 632. The groove 633 of the tape travelling passage 632 has a width W which is slightly more than that of each concave portion of the electronic component series tape T, and the same thickness as each concave portion of the carrier tape. The tape travelling passage 632 has an elongate holding plate 634 mounted on one of its sides which interpose the groove 633 therebetween. The holding plate 634 has an elongate slit formed at its side near the groove 633 of the tape travelling passage 632 so as to extend in the direction of elongation of the holding plate 634. Also, the tape travelling passage 632 has an elongate blade-like plate 635 formed on the other of its sides and extending horizontally toward the holding plate 634 in the transverse direction so as to allow a space S, substantially corresponding in width to a thickness of the cover tape of the electronic component series tape, to be left between the opposite sides of the holding plate 634 and blade-like plate 635. The electronic component series tape T is adapted to be fed forward with one edge portion of the component series tape T being inserted into the slit of the holding plate 634 and each concave portion of the electronic component series tape T being received in the groove 633 of the tape travelling passage 632. The blade-like plate 635 is squeezed between the cover tape t1 and the carrier tape t2 of the electronic component series tape T to peel the cover tape t1 from the carrier tape t2. In order to facilitate the squeezing of the blade-like plate 635 between the cover tape t1 and the carrier tape t2, the blade plate 635 is pointed at its one end portion 635a. FIGS. 23 to 25, a reference numeral 636 denotes a rising plate which extends as a continuation of the blade-like plate 635 and is supported on a portion of the other of two sides of the tape travelling passage 632 and is located near an electronic component supply position. The rising plate 636 has an upper slope 636a increasing in an advancing direction of the electronic component series tape T and a side slope 636b greater than the space S between the holding plate 634 and the blade-like plate 635, and serves to turn up the cover tape t1 which is peeled from the carrier tape t2 by means of the blade plate 635.

Incidentally, an initial end portion of the electronic component series tape T wound around the reel 630 has no concave portions and no electronic components. Setting of the electronic component series tape T in the tape feeder 600 is performed by unwinding the tape T from the reel 630 to pull the tape T forwardly, peeling an initial portion of the cover tape t1 from the carrier tape t2, causing an initial end portion of the carrier tape t2 to pass the tape travelling passage 632 with the one edge portion of the initial portion of the electronic component series tape T being received in the slit of the holding plate 634 while turning up the peeled initial portion of cover tape t1 in a direction above the blade-like plate 635 through the space S between the holding plate 634 and the blade-like plate 635, and causing the peeled initial end portion of the cover tape t1 to be again stuck onto the initial portion of the carrier tape t2 to engage the non-shown feeding perforations of the initial portion of the carrier tape with projecting teeth (identical to that shown in FIG. 20) of a tape feed drum (not shown).

In the tape feeder 600 having the electronic component series tape T set therein in the manner as described above, then the electronic component series tape T is intermittently fed upon the actuation of the tape feed drum, the blade-like plate 635 becomes squeezed between the cover tape t1 and the carrier tape t2 to peel the cover tape t1 from the carrier tape t2. The cover tape t1 is invented at its edge portion into the slit of the holding plate as described above, so that the cover tape t1 is turned up through the space S between the holding plate 634 and the blade plate 635 in a direction above the blade plate 635. Further, with advancing of the electronic component series tape T, the cover tape t1 is risen by the upper slope 636a of the rising plate 636 extending as continuation of the blade-like plate 635 and guided by the side slope 636 to be turned up laterally, resulting in an electronic component E received in a concave portion of the carrier tape t2 being exposed. Then, the exposed electronic component E is sucked up by a suction nozzle 2b of a mounting head 2. During the mounting head 2 holding the electronic component E through its suction nozzle 2b is moved toward a position above an electronic component mounting position on a printed circuit board to be moved downwardly with respect to the electronic component mounting position of the printed circuit board to mount the electronic component on the electronic component mounting position of the printed circuit board and then returns to its original position, the electronic component series tape T is advanced by a distance corresponding to that between adjacent electronic components on the tape T. Simultaneously with the advancement of the electronic component series tape T, the turned-up portion of the cover tape t1 is released from the rising plate 636, so that the portion of the cover tape t1 returns to an original state and is pulled by the tape feed drum together with an empty portion of the carrier tape t2 to be discharged.

Incidentally, as described above, the electronic component series tape T is inserted at its edge portion into the slit of the holding plate 634 and the carrier tape t2 is held down by the blade-like plate 635, so that coming-up of the carrier tape t2 from the tape travelling passage 632 and moving of electronic components within respective concave portions of the carrier tape t2 are prevented. As shown in FIG. 23, a shutter plate 638 is located next to the electronic component supply position. This shutter plate 638 is adapted to be vertically movable and is adapted to hold a portion of the carrier tape t2 from which an electronic component is removed and a portion of the cover tape t1, which positionally corresponds to the empty portion of the carrier tape t2 on the electronic component travelling passage, when a subsequent electronic component is sucked up by the suction nozzle 2b. The shutter plate 638 is pivotally connected through an axis 638a to the body 631 and has a pin 638b projecting therefrom, which pin 638b is inserted into a vertically elongate hole (not shown) formed in an upper end portion of a link bar 639. The link bar 639 is pivotally connected at its substantially middle portion to the body 631 through a pin 639a supported to body 631. Stretched between the lower end portion of the link bar 639 and the body 631 is a tension spring 640. Due to the action of the tension spring 640, the shutter plate 638 is always pushed up by the link bar 639. In FIG. 23, a reference numeral 642 denotes a drive cylinder mounted on the body 631. When the drive cylinder 642 is actuated to extend its rod and the rod of the drive cylinder 642 is abutted against a pin 643, which is movably supported on the body 631, to thrust the pin 643 toward the link bar 639 to cause the pin 643 to abut against the link bar 639, the link bar 639 is rotated about the pin 639a, thereby causing the shutter plate 638 to move downwardly.

Referring to FIGS. 26 to 38, there is shown storage means 700 for storing electronic components therein and also serving as an electronic component supply source.

Figure 26:
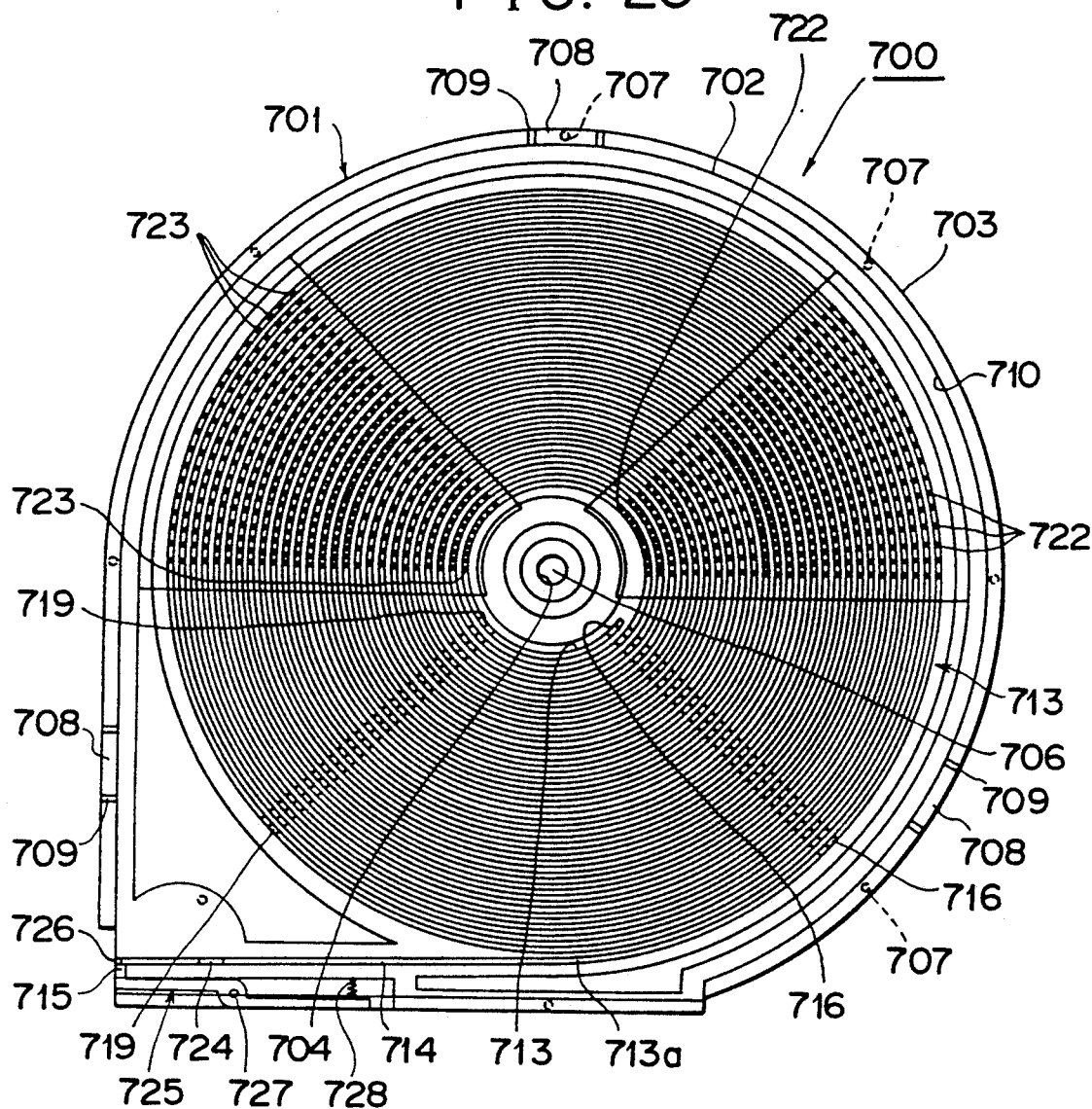
FIG. 26 is a front view of electronic component storage means which also serves as a parts feeder.
Figure 27:
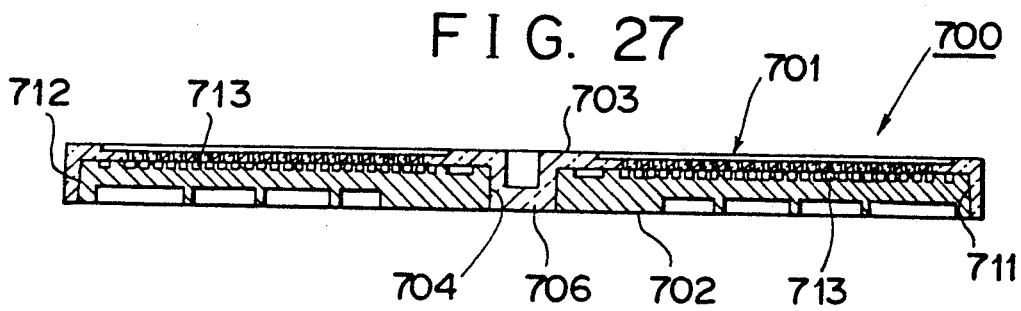
FIG. 27 is a transverse cross section of the electronic component storage means.

As shown in FIGS. 26 and 27, the storage means 700 includes a plate-like case body 701. The body 701 includes a base portion 702 carrying thereon a plurality of electronic components and a cover plate portion 703 for covering the base portion 702. The base portion 702 has a vertical through-hole 704 formed at its central portion and dowel holes 705 (only one is shown in FIG. 28) formed therein near a periphery of the base portion 702. The cover plate portion 703 has a vertical boss portion 706 projecting at its central portion and pins 707 (only one is shown in FIG. 28) protruding downwardly from the cover plate 703 at positions of the cover plate portion 703 which correspond to the dowel holes 705 of the base portion 702. The base portion 702 and cover plate portion 703 are fitted into each other by fitting the boss portion 706 of the cover plate portion 703 into the through-hole 704 of the base portion 702 and fitting the pins 707 of the cover plate portions 703 into the dowel holes 705 of the base portion 702. Also, the base portion 702 has protruding pieces 708 formed around the base portion 702, whereas the cover plate portion 703 has cutouts 709 formed at its peripheral rising portion 710 at locations which correspond to the protruding pieces 708 of the base portion 702, thereby facilitating the fitting operation of the cover plate portion 703 and the base portion 702. Further, a peripheral portion of the base portion 702 is formed with a peripheral tapered surface 711, whereas the rising portion 710 of the cover plate portion 703 is formed at its inner surface with a mating peripheral tapered surface 712, thereby also facilitating the fitting operation of the cover plate 703 and the base portion 702. The base portion 702 has a groove 713 of a substantially spiral shape in which a plurality of electronic components are received, facing in a predetermined direction. This groove 713 is of a substantially U-shape a vertical section, which corresponds to the shape of each of the electronic components as shown in FIG. 29 and extends from the central portion of the base portion 702 to the peripheral portion of the base portion 702. A terminal portion 713a of the groove 713 communicates through a linear groove 714 with an electronic component outlet 715. Incidentally, the base portion 702 is preferably formed of resinous materials in order to facilitate a smooth moving of the electronic components. Also, in order to prevent producing of static electric charge, the inner surface of the groove 713 is preferably coated with fluorine. Further, the cover plate portion 703 may be formed of transparent materials.

The base portion 702 further has a series of first elongate through-holes 716 disposed along its radial direction from the central portion of the base portion 702 and located at bottom portions of the groove 713, each of the first through-holes 716 being of a substantially rectangular shape as shown in FIG. 30, and of a size less than a width of each of the electronic components. Into each of the first through-holes 716 a tip end of an air nozzle 717 (see FIGS. 30 and 31) is inserted as described in greater detail hereinafter. As shown in FIG. 31, each of the first through-holes 716 is preferably formed at its wall with a rising slope surface 718 ascending in a direction of the electronic components fed by air from the air nozzle 717. Also, the first through-holes 716, as shown in FIG. 26, are preferably formed at the lower half area of the base portion 702. The lower half area of the base portion 702 has a series of second through-holes 719 formed therein in the same manner as the first through-hole 713. The of the second through-holes 719 are spaced from the first through-holes at a desirable angular space. In each of the second through-holes 719, a nozzle is inserted at its tip portion, with the tip portion of the nozzle facing in a direction opposite to a direction of the tip end of the nozzle 717 inserted in each of the first through-holes 713 so that each of the second through-holes 719 is formed at its wall with a rising slope surface ascending in a direction reverse to the rising slope surface 718 of each of the first through-holes 713.

As shown in FIG. 32, the base portion 702 further has a first frame portion 720 of a substantially ellipse shape and a second frame portion 721 of a substantially ellipse shape which are formed on the back side of the base portion 702. The first and second frame portions 720 and 721 are arranged to surround the series of the first through-holes 716 and the series of the second through-holes 719, respectively, whereby couplings for binding together a plurality of the air nozzles inserted in the respective through-holes can be fitted in the respective frame portions 720, 721. Also, the base portion 702 has a series of third through-holes 722 and a series of fourth through-holes 723 which are formed on the upper half area of the base portion 702 as shown in FIG. 26. Each of the third and fourth through-holes serves as means to discharge air supplied by the above described nozzles. The third and fourth through-holes 722, 723 are formed along radial directions from the central portion of the base portion 702, located at the bottom portion of the groove 713, and arranged in rows in the radial directions, respectively. Also, an air inlet 724 may be formed in a portion of the base portion 705 near the electronic component outlet 715 described above so as to be formed obliquely to the electronic component feeding direction.

Figure 33:
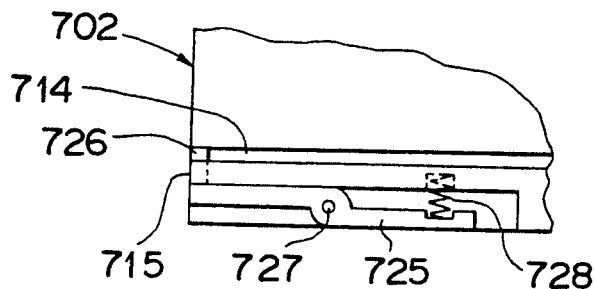
FIGS. 33 and 34 are a fragmentary front view and a fragmentary side view of a shutter mechanism, respectively.
Figure 34:
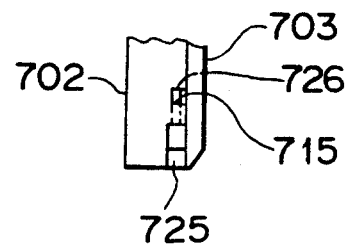

The electronic component outlet 715 is provided at its one end with a shutter 725 for separating one by one electronic components fed toward the outlet 715 as shown in FIGS. 26, 33 and 34. The shutter 725 is provided with a pawl 726 at its one end and projecting in the electronic component outlet 715, and pivotally connected at its middle portion to the base portion 702 through a pin 727. There is a spring 728 arranged between the other end of the shutter 725 and the base portion 702, so that the shutter 725 is urged by the spring 728. When the shutter 725 is thrust up at the other end thereof against the action of the spring 728 by means of an ejector pin described later to be pivotally moved about the pin 727, the outlet 715 closed by the pawl 726 is opened. Synchronously with the feeding operation of air into the groove 713 through the first and second through-holes 716, 719, the shutter 725 is pivotally moved, thereby causing one by one electronic components, fed toward the outlet 715, to be separated to discharge them from the outlet.

Figure 35:
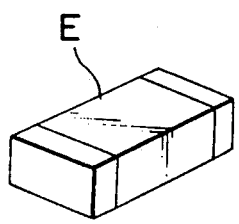
FIG. 35 is a schematic perspective view showing one example of an electronic component which may be stored in the storage means of FIG. 26.

In the storage means 700 constructed as described above, chip-type electronic components E, e.g., condensers resistors or the like as shown in FIG. 35 are packed in the groove 713. Packing operation of electronic components in the groove 713 is easily carried out by removing the cover plate portion 703 from the base portion 702, putting electronic components on the base portion 702 and vibrating the base portion 702 in order to move the electronic components in the groove 713. also, during manufacturing of the storage means, the packing operation of electronic components in the groove 713 may be carried out by feeding electronic components one by one in the groove 713 through the electronic component outlet 715 and simultaneously feeding air through the second through-holes 719.

Figure 36:
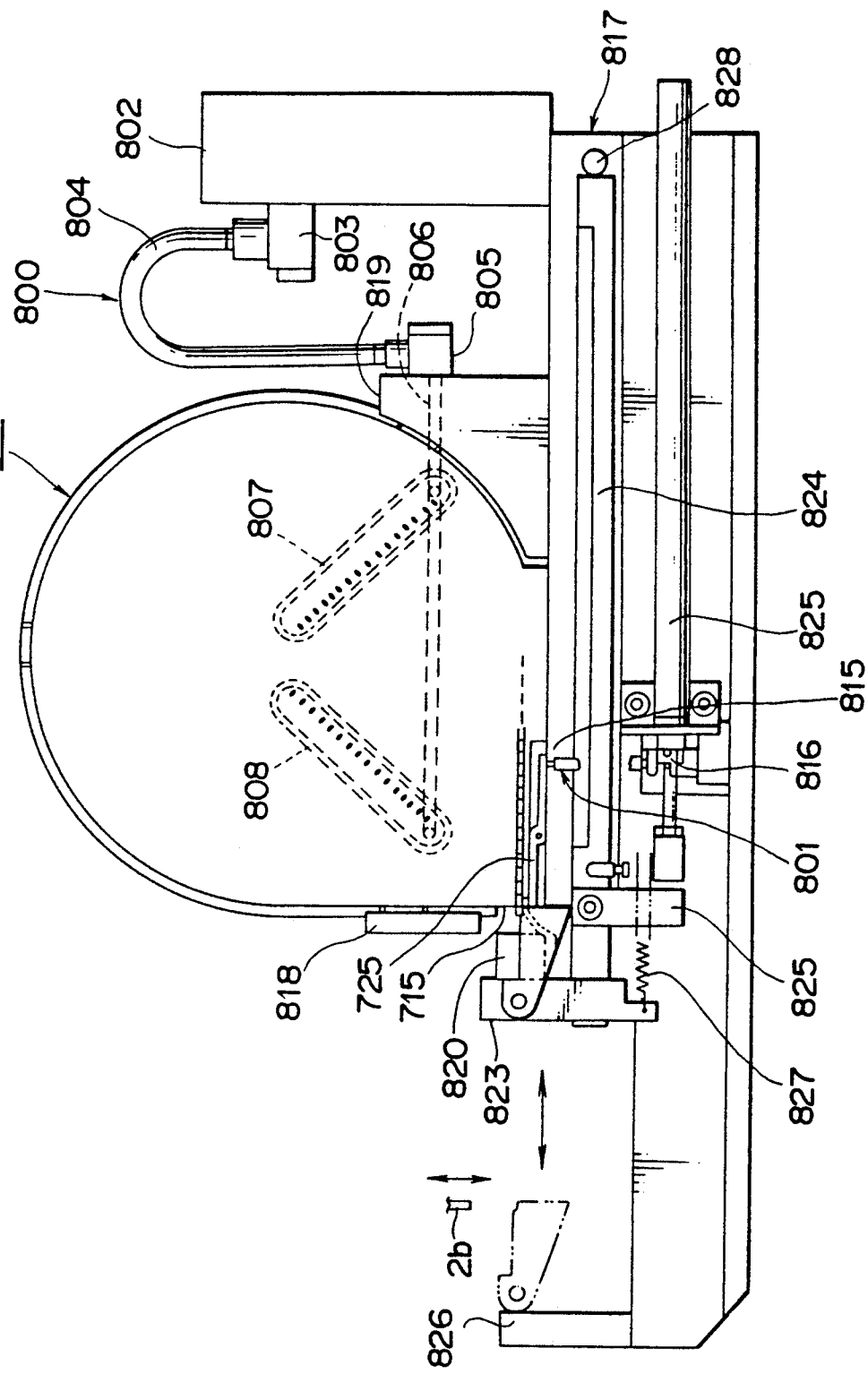
FIG. 36 is a front view of an electronic component supply mechanism.
Figure 37:
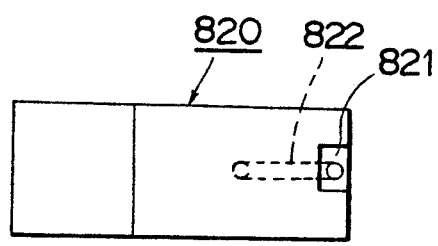
FIG. 37 is a plan view of a receiving base for receiving an electronic component.
Figure 38:
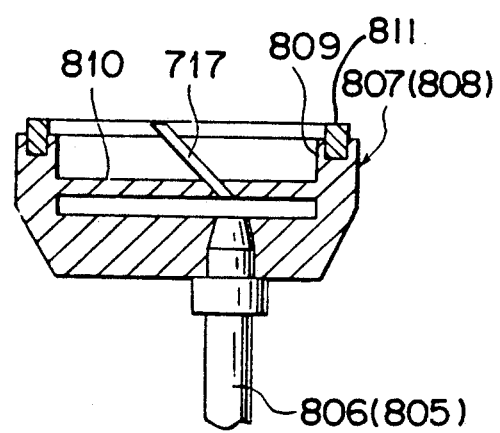
FIG. 38 is a sectional view of a coupling.

The storage means 700 (FIG. 36) is installed in an electronic component supply mechanism including an air supply mechanism 800 and drive means 801 for driving the shutter 725. Electronic components discharged from the storage means 700 are fed to an electronic component mounting position and then picked up one by one by a mounting head. The air supply mechanism 800 includes an air valve 802 having a coupling 803, a connecting pipe 804 connected at its one end to the coupling 803, and a branched pipe having a first pipe 805 and second pipe 806 and connected to the other end of the connecting pipe 804. To each tip end of the pipes 805, 806, a coupling 807 (or 808) having an opening of a size sufficient to surround the first through-holes 716 (or the second through-holes 719) is connected. The coupling 807 (or 808) as shown in FIG. 38 is of a cup shape and has a peripheral wall 809 which is fitted in the frame portion 720 (or 721) of a substantially ellipse shape formed on the back side of the base portion 702, and is provided in its interior with a partition wall 810 for dividing the interior into an opening side and a side connected to the pipe 805 (or 806) of the branched pipe. A plurality of air nozzles 717 (only one is shown in FIG. 38) corresponding in number to the first through-holes 716 (or the second through-holes 719) are supported to the partition 810 with their tip ends facing toward the opening side, each of which through-holes extending obliquely at 45° to the partition 810. In order to provide air tightness, a rubber ring 811 of a substantially O shape is mounted on the opening side of the coupling 807 (or 808). The coupling 807 and 808 may be connected to drive means and, when the storage means 700 is installed in or removed from the electronic component supply mechanism, the couplings 807 and 808 approach or moved away from the back side of the storage means by the actuation of the drive means. The shutter driving means 801 includes an ejector pin 815 mounted on a tip end of the rod of a drive cylinder 816. The air supply mechanism 800 and the shutter driving means 801 are mounted on a base 817 of the electronic component supply mechanism. On the base 817, stand frames 818, 819 for holding the storage means 700 from righ and left sides are mounted. Also, a receiving base 820 for receiving electronic components discharge from the outlet 715 is provided near the outlet 715 as shown in FIG. 36 and. FIG. 37. The receiving base 820 includes a cutout 821 of a size sufficient to receive one electronic component, and an air passage 822 obliquely extending from the cutout 821 downward and connected to an air-absorbing source. Also, the receiving base 820 is mounted through a bracket 823 (FIG. 36) on a tip end of a sliding bar 824 which is slidably supported to the base 817, whereby the receiving base 820 can be moved forward and backward. The sliding bar 824 has a projecting piece 825 mounted on its axis. In FIG. 36, a reference numeral 825 denotes a drive cylinder which is horizontally supported by the base 817. When the drive cylinder 825 is actuated to extend its rod, the rod of the cylinder 825 abuts against the projecting piece 825 to cause the sliding bar 824 to be moved forward. In a position of the base 817 at which the sliding bar 824 is moved forward, a stopper piece 826 for stopping the sliding bar 824 is mounted. A tension spring 827 is stretched between the bracket 823 and a predetermined position of the base 817, whereby the receiving base 820 is always urged backward. When the cylinder 825 is actuated to retract its rod, the sliding bar 824 is moved backward due to the action of the tension spring 827 to be stopped against a stopper 828. Above a position at which the receiving base 820 is abutted against the stopper piece 826, a mounting head having a suction nozzle 2b is located.

The storage means 700 is mounted on the base 817 with the component outlet 715 being located at a lower position. The couplings 807 and 808 are located on the back side of the case body 701 so as to be fitted into the frame portions 720, 721, respectively. When the couplings 807 and 808 are fitted into the frame portions 720, 721, each nozzle 717 is located obliquely with respect to the correspnding through-hole 716 (or 719). When air is supplied to each air nozzle 717 from the air valve 802, the air is intermittently fed into the groove 713, whereby the electronic components received in the spiral groove are moved along portions of the groove 713 toward the upper half area of the case body 701. When supply of air is stopped, the electronic component is moved along the portions of the groove 713 toward the lower half area of the case body 701. Such movement of the electronic components is repeated in a predetermined interval of time by feeding air in an opposite direction by means of the couplings 807 and 808. At this time, air supplied by the coupling 807 and air supplied by the coupling 808 flow in the groove 713 in directions opposite to each other, so that when the air supplied from the coupling 807 and the air supplied from the coupling 808 strike each other, a repulsive force is produced, resulting in the halves of the electronic components and the other halves being moved in a clockwise direction and a counterclockwise direction, respectively. When foremost ones of the halves moved in the clockwise direction and foremost ones of the other halves moved in the counterclockwise direction strike one another at a central portion of the upper half of the case body 701, the electronic components come to gradually move toward the terminal portion 713a of the groove 713. Air supplied from the couplings 807 and 808 is discharged through the third through-holes 722 and fourth through-holes 723. At this time, the electronic components are moved downwardly along position of groove 713 by gravity. When the electronic components are moved downwardly in a manner as described above, a foremost electronic component reaching the linear groove 714 is moved toward outlet 715, closed by the shutter 725, by the subsequent electronic components. Then, when the shutter is pivotally moved by the ejector pin 815 acting synchronously with the operation of the air valve 802 to cause the outlet 715 to be opened, the electronic component is discharged from the outlet 715 by air supplied from air valve 802 to flow into the receiving base 820 through the cutout 821. After, the receiving base 820 receives the electronic component, the receiving base 820 is moved to the electronic component supply positioned and then is sucked up by the suction pin. Also, after one component is discharged from the outlet 715, the actuation of the ejector pin 815 is stopped immediately, resulting in that shutter 725 is returned to an original condition due to the force of spring 728, whereby the outlet 715 is again closed.

What is claimed is:

1. An automatic electronic component mounting apparatus comprising:
   at least one electronic component supply mechanism for supplying an electronic component to a predetermined position;
   at least one mounting head;
   first driving means for moving said at least one mounting head in a Y direction;
   a frame, and second driving means for moving said frame in an X direction, said frame being located in a Y directional position;
   a support base supported to said frame and projecting horizontally from said frame;
   table means for carrying a printed circuit board thereon and third driving means for turning said table means in a $\theta$ direction, said table means being rotatably supported to said support base of said frame, so that said table means is located in the Y directional position, and when said frame is moved in the X direction by said second driving means, said table means is also moved in the X direction; and
   controlling means for controlling an actuation of said first, second and third driving means as required, thereby controlling the Y directional position of said at least one mounting head, the X directional position of said table means supported to said support base of said frame, and a $\theta$ directional position of said table means;
   said controlling means being electrically connected to said first, second and third driving means;
   said at least one mounting head being adapted to hold an electronic component at said predetermined position to be moved in the Y direction by said first driving means to mount the electronic component on said printed circuit board.

2. An appartus as defined in claim 1, including a plurality of mounting heads arranged along the X direction, said mounting heads being movable in the Y direction separately.

3. An apparatus as defined in claim 1, wherein said at least one mounting head includes a body; at least two suction nozzles different in diameter from each other and pivotally connected to a lower end portion of said body, said at least two suction nozzles being adapted for sucking an electronic component at said predetermined position and adapted to release said electronic component when said electronic component is to be mounted on said printed circuit board; switching means for selectively applying negative pressure or positive pressure to said at least two suction nozzles; and drive means for selectively actuating one of said at least two suction nozzles to be coupled to said switching means.

4. An apparatus as defined in claim 3, and further including a nozzle holder pivotally connected to said lower end portion of said body so as to pivot by a predetermined angle, said at least two suction nozzles being supported by said holder such that axes of said at least two suction nozzle radially extend from a pivotal point of said nozzle holder and are aligned in a pivotal movement direction.

5. An apparatus as defined in claim 4, wherein said at least one mounting head includes a lever arm pivotally connected to said lower end portion of said body; a tension spring stretched between said lever arm and said body; and a drive cylinder for causing said lever arm to be pivotally moved by the predetermined angle against the action of said spring, said nozzle being mounted on said lever arm.

6. An apparatus as defined in claim 3, wherein said switching means includes a body formed with a recess, a first passageway communicating with said recess and connected to an air supply source, a second passageway communicating with said recess and connected to a vacuum source; a disk-like valve member received in said recess of said body and rotatable in clockwise and counterclockwise directions, and including first and second paths for selectively communicating with any one of said first and second passageways, respectively, when said valve member is rotated, to apply negative pressure or positive pressure to one of said at least two suction nozzles, and first and second cutouts formed at portions of a periphery of said disk-like valve member; first and second vertical switching pins inserted in said body to be engaged with said first and second cutouts of said valve member at lower end portions thereof, respectively, with upper end portions thereof being projected upwardly from said body; a swing plate located above said first and second switching pins; and drive means for causing said swing plate to swing so that when said swing plate is swung in one of clockwise and counterclockwise directions by said drive means, said swing plate strikes one of said switching pins so as to cause said valve member to be rotated.

7. An apparatus as defined in claim 1 wherein said table means includes a table and a positioning mechanism for positioning a printed circuit board on said table.

8. An apparatus as defined in claim 7, wherein said positioning mechanism includes a support plate; said table being located above said support plate and having guide passages; a lever arm pivotally connected at one end thereof to said support plate and being rotatable in a predetermined direction; a horizontal holding plate pivotally connected to a free end of said lever arm; holding rollers mounted on two end portions of said holding plate for moving while being guided along said guide passages due to rotation of said lever arm to push a printed circuit board positioned on said table; and regulating rollers for holding said printed circuit board pushed by said holding rollers to position said printed circuit board in cooperation with said holding rollers.

9. An apparatus as defined in claim 1, wherein said at least one electronic component supply mechanism is selected from the group consisting of a bulk feeder, a pallet feeder, a magazine feeder, and a tape feeder.

10. An apparatus as defined in claim 1, wherein said at lest one electronic component supply mechanism is a tape feeder for feeding an electronic component series tape, said electronic component series tape including a carrier tape, an adhesive tape and a plurality of electronic components held on said carrier tape through said adhesive tape, and wherein said tape feeder includes a body, a tape travelling passage means provided on said body, a tension roller located on said body under said tape travelling passage means and being operative for peeling a portion of said adhesive tape from said carrier tape synchronously with a holding operation of an electronic component by said at least one mounting head, and a tape feed drum located on said body in advance of said tape travelling passage means and being operative for pulling a portion of said carrier tape, from which electronic components are removed by said at least one mounting head, together with a peeled portion of said adhesive tape.

11. An apparatus as defined in claim 1. wherein said at least one electronic component supply mechanism is a tape feeder for feeding an electronic component series tape, a carrier tape, a plurality of electronic components held on said carrier tape and a cover tape; and wherein said tape feeder includes a tape travelling passage having a groove for receiving said electronic component series tape, a holding plate having a slit for receiving one edge portion of said electronic component series tape and located on one of two sides of said travelling passage interposing said groove therebetween; a blade-like plate arranged on said traveling passage to be spaced from said holding plate by a distance corresponding to a thickness of said cover tape and being squeezed between said carrier tape and said cover tape to turn up a portion of said cover tape and peel the portion of said cover tape from said carrier tape; a rising plate extending as continuation of said blade-like plate, located near a position at which electronic components are removed from said carrier tape one by one by said at least one mounting head, and having a rising slope for turning up the portion of said cover tape; and means for pulling the portion of said cover tape to cause the portion of said cover tape to be released from said rising slope of said rising plate and advancing the portion of said cover tape together with a portion of said carrier tape from which electronic components are removed by said at least one mounting head.

12. An apparatus as defines in claim 1, and further including picture processing means, first means for picking up a picture of an electronic component held by said at least one mounting head to send said picture to said picture processing means, and second means for picking up a picture of a positioning mark previously applied onto said printed circuit board to send said picture of said positioning mark to said picture processing means, said first and second picture picking-up means being electrically connected to said picture processing means.

13. An apparatus as defined in claim 12, wherein said first picture picking-up means includes a line sensor arranged in such a manner that a one-dimensional visual field thereof is directed in a direction perpendicular to a moving direction of said at least one mounting head, said line sensor being adapted to pick up a picture of an electronic component held by said at least one mounting head to output a one-dimensional image signal on said picture, and memory means electrically connected to said line sensor for periodically taking said one-dimensional image signal outputted from said line sensor.

14. An apparatus as defined in claim 1, wherein said at least one mounting head includes a body of a substantially cup-like shape, a reflector contained in said body, light-emitting elements mounted on an undersurface of said reflector, a light scattering plate for scattering light emitted from said light-emitting elements and fixed on an open lower end side of said body, and a suction nozzle for holding an electronic component supplied by said at least one electronic component supply mechanism, said suction nozzle being connected to a vacuum source and being supported to said body so as to penetrate said reflector and said light scattering plate, said light-emitting elements being arranged on said undersurface of said reflector so as to surround said suction nozzle penetrating said reflector; and wherein said apparatus further includes means for picking up a picture of an electronic component held by said suction nozzle.

15. A method of mounting electronic components on a printed circuit board, comprising the steps of:
preparing an electronic component supply unit including a plurality of parts feeders;
preparing a plurality of mounting heads for holding electronic components supplied from said supply unit to mount the electronic components in a plurality of electronic component mounting positions of a printed circuit board, said mounting heads being adapted to be moved in a Y direction separately;
preparing a printed circuit board supporting mechanism for supporting said printed circuit board, said printed circuit board supporting mechanism being adapted to be moved in an X direction perpendicular to the Y direction;

taking into consideration positions of components in the electronic component supply unit, the condition of actuation of each mounting head and electronic component mounting positions of a printed circuit board to firstly select one of electronic components which is regarded as that having the least idle waiting time with reference to the mounting heads, to mount the electronic component on the printed circuit board; and next selecting one of the remaining electronic components in order which is regarded as that having the least idle waiting time with reference to the mounting heads, to mount the electronic component on the printed circuit board.

16. A method of mounting electronic components on a printed circuit board as defined in claim 15, and further comprising the steps of: indicating the electronic component mounting positions of the printed circuit board according to a mounting program, without indicating the mounting order of said electronic components; providing an arithmetic control unit for receiving data on the positions of the electronic components in the electronic component supply unit, data on the condition of actuation of each mounting head and data on the electronic component mounting positions on the printed circuit board; and selecting an electronic component to be next mounted on the printed circuit board, by said arithmetic control unit.

17. A method of mounting electronic components on a printed circuit board as defined in claim 15, comprising the step of providing said printed circuit board supporting mechanism with a table for carrying said printed circuit board thereon, said table being turnable so that when said table is turned, said printed circuit board on said table is also turned.

18. A method of mounting electronic components on a printed circuit board as defined in claim 17, and further comprising the steps of: indicating the electronic component mounting positions of the printed circuit board according a mounting program, without indicating the mounting order of said electronic components; providing an arithmetic control unit for receiving data on the positions of electronic components in the electronic component supply unit, data on the condition of actuation of each mounting head and data on the electronic component mounting positions of the printed circuit board; and selecting an electronic component to be next mounted on the printed circuit board by said arithmetic control unit.

19. A method of mounting electronic components on a printed circuit board, comprising the steps of:
preparing an electronic component supply unit including a plurality of parts feeders;
preparing a plurality of mounting heads for holding electronic components supplied from said supply unit to mount the electronic components in a plurality of electronic component mounting positions of a printed circuit board, said mounting heads being adapted to be moved in a Y direction separately;
preparing a printed circuit board supporting mechanism for supporting said printed circuit board, said printed circuit board supporting mechanism being adapted to be moved in an X direction perpendicular to the Y direction;
determining by an image processing unit whether a condition of an electronic component held by each mounting head is proper or improper;

taking into consideration positions of electronic components in the electronic component supply unit, the condition of actuation of each mounting head and electronic component mounting positions of a printed circuit board, to judge results obtained by the image processing unit and in the case where the condition of an electronic component held by each mounting head is determined to be proper to firstly select one of electronic components which is regarded as that having the least idle waiting time with reference to the mounting heads; and next selecting one of the remaining electronic components in order which is regarded as that having the least idle waiting time with reference to the mounting heads, to mount the electronic component on the printed circuit board; and selecting one of electronic components which is regarded as that having the least idle waiting time with reference to the mounting head, in the case where the condition of an electronic component held by each mounting head is determined to be improper, to mount the electronic component on the printed circuit board.

20. A method of mounting electronic components on a printed board as defined in claim 19, and further comprising the steps of: indicating the electronic component mounting positions of the printed circuit board according a mounting program, without indicating the mounting order of said electronic components; providing an arithmetic control unit for receiving data on the positions of electronic components in the electronic component supply unit, data on the condition of actuation of each mounting head and data on the electronic component mounting positions of the printed circuit board; and selecting an electronic component to be next mounted on the printed circuit board by said arithmetic control unit.

21. A method of mounting electronic components on a printed circuit board as defined in claim 19, comprising the step of providing said printed circuit board supporting mechanism with a table for carrying said printed circuit board thereon, said table being turnable so that when said table is turned said printed circuit board on said table is also turned.

22. A method of electronic components on a printed circuit board as defined in claim 21, and further comprising the steps of: indicating the electronic component mounting positions of the printed circuit board according a mounting program, without indicating the mounting order of said electronic components; providing an arithmetic control unit for receiving data on the positions of electronic components in the electronic component supply unit, data on the condition of actuation of each mounting head and data on the electronic component mounting positions of the printed circuit board; and selecting an electronic component to be next mounted on the printed circuit board by said arithmetic control unit.

23. A method of mounting an electronic component on a printed circuit board, comprising the steps of:
providing an electronic component supply unit for supplying an electronic component;
providing a mounting head for holding said electronic component to mount it on a print pattern previously formed on said printed circuit board;
providing first picture picking-up means for picking up pictures of electrodes of the electronic component held by said mounting head;

providing second picture picking-up means for picking up pictures of predetermined portions of the print pattern of said printed circuit board;

providing a picture processing unit electrically connected to said first and second picture picking-up means;

providing a CAD unit electrically connected to said picture processing unit and supplying data on requirements for constituting a circuit to said picture processing unit;

picking up the pictures of the predetermined portions of the print pattern by said second picture picking-up means to send the pictures to said picture processing unit;

processing the pictures of the predetermined portions of the print pattern, according to said date supplied from said CAD unit, by said picture processing unit to recognize the pictures of the predetermined portions of the print pattern;

extracting pictures of electrode portions of the print pattern, with which electrode portions of said electronic component are to be brought into contact when the electronic component is mounted on said printed circuit board, from the pictures of the predetermined portions of the print pattern;

picking up the pictures of the electrodes of the electronic component held by said mounting head to send the pictures of the electrodes of the electronic component;

processing the pictures of the electrodes of the electronic component by said picture processing unit to recognize the pictures of the electrodes of the electronic component;

processing the recognized pictures of the electrode portions of the print pattern and the recognized pictures of the electrode portions of the electronic component in a manner to cause the pictures of the electrode portions of the electronic component to be superposed on the pictures of the electrode portions of the print pattern and compensating a position of the electronic component held by the mounting head; and thereafter mounting the electronic component on the printed circuit board.

* * * * *